United States Patent
Shah et al.

(10) Patent No.: US 9,218,892 B2
(45) Date of Patent: Dec. 22, 2015

(54) ERROR PREDICTION IN LOGIC AND MEMORY DEVICES

(71) Applicant: Texas Instruments Incorporated, Dallas, TX (US)

(72) Inventors: Dharin N. Shah, Bangalore (IN); Sharad Gupta, Bangalore (IN); Vinod Joseph Menezes, Bangalore (IN); Vish Visvanathan, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/300,900

(22) Filed: Jun. 10, 2014

(65) Prior Publication Data

US 2015/0082105 A1 Mar. 19, 2015

Related U.S. Application Data

(62) Division of application No. 13/567,512, filed on Aug. 6, 2012, now Pat. No. 8,762,804.

(51) Int. Cl.
*G01R 31/30* (2006.01)
*G06F 11/00* (2006.01)
*G11C 29/02* (2006.01)
*G06F 11/24* (2006.01)
*G11C 29/44* (2006.01)
*G11C 29/04* (2006.01)

(52) U.S. Cl.
CPC .............. *G11C 29/021* (2013.01); *G06F 11/24* (2013.01); *G11C 29/44* (2013.01); *G11C 2029/0409* (2013.01)

(58) Field of Classification Search
CPC ........ G11C 29/14; G11C 16/10; G11C 16/12; G11C 29/785; G11C 16/3436; G11C 16/344; G11C 16/3454; G11C 29/34; G11C 29/52; G11C 16/24; G11C 29/021; G11C 29/44; G11C 2029/0409; G06F 11/1008; G06F 11/1068; G06F 2201/81; G06F 2212/2022; G06F 11/24
See application file for complete search history.

*Primary Examiner* — Guerrier Merant
(74) *Attorney, Agent, or Firm* — John R. Pessetto; Frank D. Cimino

(57) ABSTRACT

Potential errors that might result from operating logic and/or memory circuits at an insufficient operating voltage are identified by electrically altering nodes of replica or operational circuits so that the electrically altered nodes are susceptible to errors. The electrically altered nodes in an embodiment are controlled using parametric drivers. A minimized operating voltage can be selected by operating at a marginal operating voltage and detecting a voltage threshold at which errors in the electrically altered nodes are detected, for example.

9 Claims, 13 Drawing Sheets

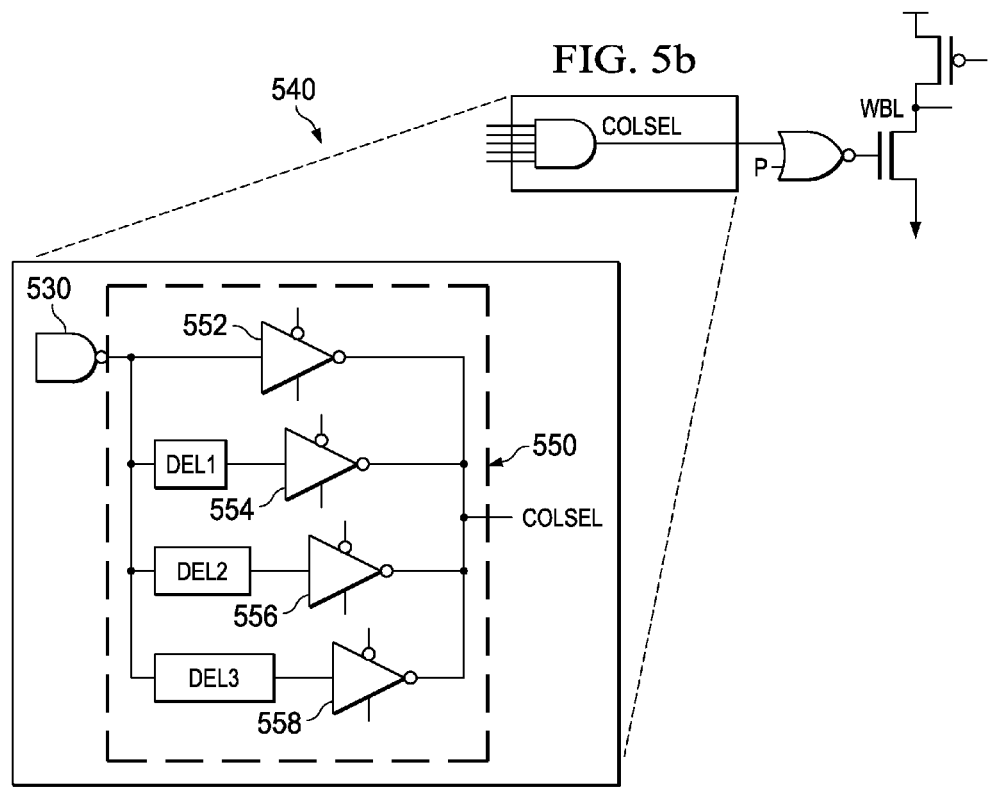
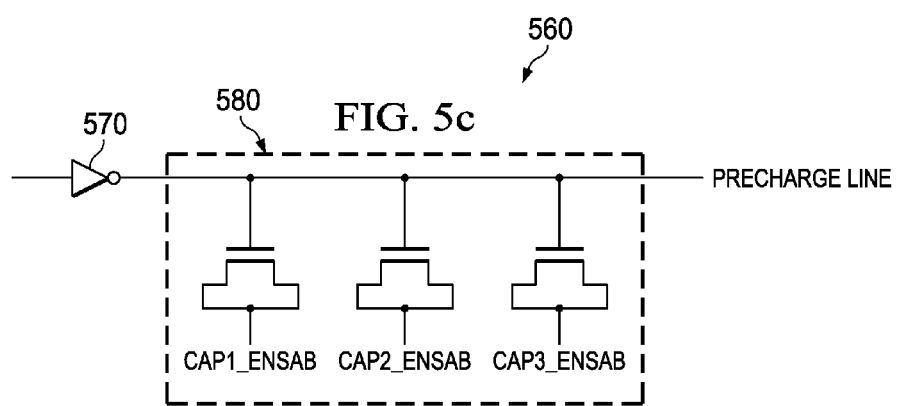

ERROR PREDICTION IN LOGIC AND MEMORY DEVICES

CROSS-REFERENCE TO RELATED APPLICATIONS

This application is a divisional of U.S. patent application Ser. No. 13/567,512, filed Aug. 6, 2012, which is herein incorporated by reference.

BACKGROUND

Electronic systems are being designed to in accordance with increasingly more stringent design requirements. Designing the electronic systems in accordance with increasingly more stringent design requirements often in power savings, faster performance, and enriched capabilities due to increased integration. With such electronic systems with finer design features, it is becoming more difficult to maintain proper operation of electronic devices within the processing systems because of stricter tolerances. It is also more difficult to maintain proper operation as the devices over time because the electrical characteristics of electronic devices in the electrical systems change over time as the electronic devices age due to usage.

SUMMARY

The problems noted above are solved in large part by detecting potential errors that might result from operating logic and/or memory circuits at an insufficient operating voltage. The potential errors are identified by electrically altering nodes of replica or operational circuits so that the electrically altered nodes are more susceptible to errors (than the unaltered nodes, for example). The electrically altered nodes in an embodiment are controlled using parametric drivers. A minimized operating voltage can be selected by operating at a marginal operating voltage and detecting a voltage threshold at which errors in the electrically altered nodes are detected, for example.

BRIEF DESCRIPTION OF THE DRAWINGS

FIGS. 5a, 5b and 5c shows schematic diagrams illustrating various parametric drivers in an error-predicting system in accordance with embodiments of the disclosure;

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
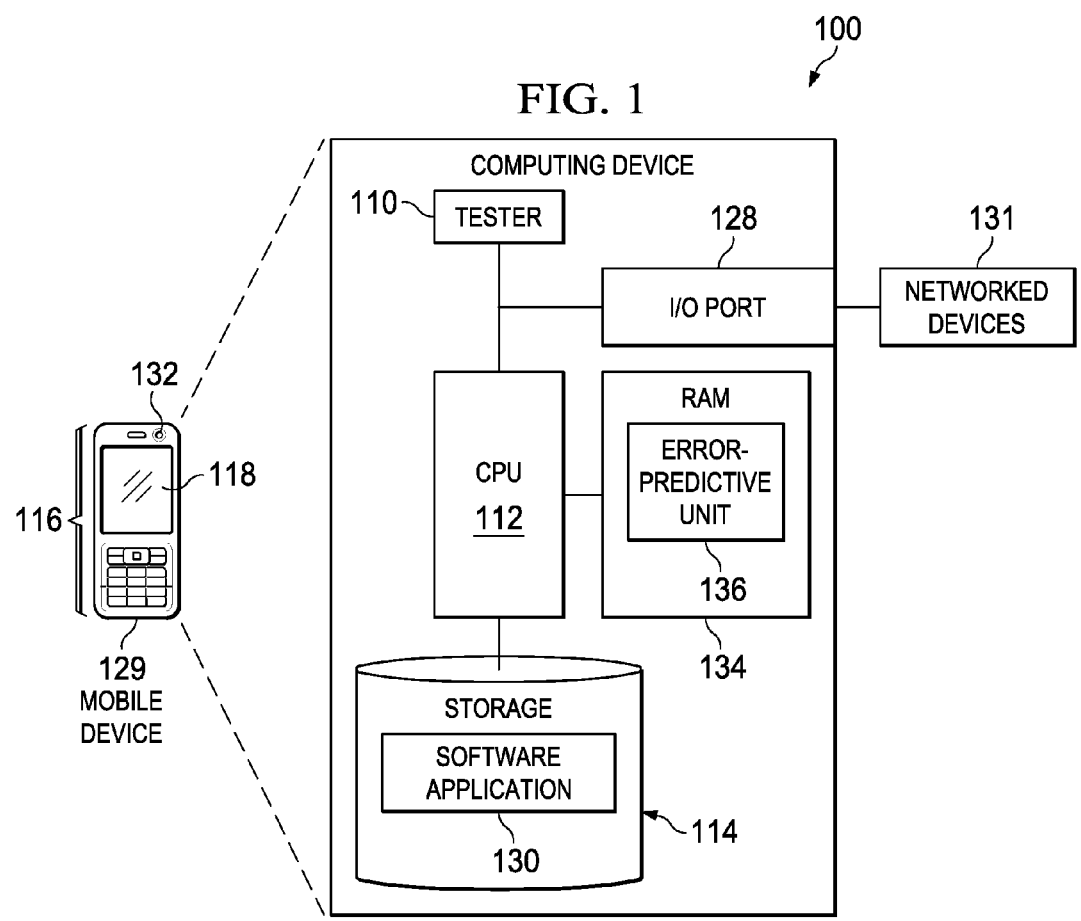
FIG. 1 shows an illustrative computing device in accordance with embodiments of the disclosure.

FIG. 1 shows an illustrative computing device 100 in accordance with embodiments of the disclosure. For example, the computing device 100 is, or is incorporated into, a mobile communication device 129, such as a mobile phone, a personal digital assistant (e.g., a BLACKBERRY® device), a personal computer, automotive electronics, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The CPU 112 can include (or be coupled to) RAM 134, which can be static or dynamic RAM arranged in a common (or separate) substrate. RAM 134 includes an error-predictive unit 136 that is used to detect various kinds of setup violations at different operating voltages as disclosed herein below.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

Various conditions and events and can cause failures in electronic devices (such as RAM 143) of computing systems. Such failures increasingly occur due to the lowering supply voltages based on process strength (the ability to withstand degradation of component features due to aging, for example) and environmental conditions.

Various systems use a variety of methods and systems to minimize the occurrence of such failures. Some conventional error prediction systems assess the likelihood of such failures by using adaptive voltage scaling (AVS) to determine a minimum-acceptable operating voltage at which an acceptable error rate (including an error-free rate) occurs in an asynchronously propagated (e.g., unlatched) logic or memory path. The minimum-acceptable operating voltage is determined during boot time (and/or during test time). Other conventional systems incorporate tracking circuits—such as ring oscillators based on inverters, NAND- (negated logical-AND), and NOR- (negated logical-OR) gates—that track the frequency-related changes in performance during run time and adjusts the supply voltage to obtain a desired frequency.

In view of the teachings disclosed herein, it is noted that AVS systems such as the ring oscillator tracking circuits and error prediction systems for detection asynchronously propagated logic path fail to address capture potential setup issues in the propagation of a signal in the asynchronously propagated paths. The design and implementations of the asynchronously propagated logic paths often result in setup violations due to aging, temperature variation or VDD droop that could go undetected during initial testing.

In order to prevent possible setup violations due to a lowered operating voltage (e.g., VDD), the operating voltage is often adjusted upwards to include a guard band, which further reduces the likelihood of errors in the asynchronously propagated logic path. However, the increased voltage from the guard band results in higher power dissipation (at a given frequency) due to the guard band. As disclosed herein, in-situ setup violation detection circuits in logic and memory paths are arranged to detect setup violations in, for example latches and memory devices operating at reduced guard band levels.

Memory-related logic paths such as memory-to-logic interface paths and memory bit cell-related paths are verified during initial testing and a "passing Vmin" value is determined in response to a minimum-acceptable operating voltage determined during the initial testing. Once the "passing Vmin" for the given die is determined, voltage margins are added on top of it in order to account for aging, temperature response variation, VDD droop variation, and the like. The sum of the voltage margins is referred to as the guard-band. An example guard band could vary from ~60-80 mV to as high as around 140 mV in order to account for aging and/or temperature variations, VDD variation, and the like. The use of an augmented guard band could result in extra power dissipation that could be as high as 10-12% or more of the overall power consumption. As disclosed herein, the use of the in-situ setup violation detection circuits in logic paths allows reduced guard bands in order to increase power savings.

The use of the in-situ setup violation detection circuits enables the actual operating voltage to be brought down to a just-passing level. The use of the in-situ setup violation detection circuits in memory circuits also ensures that insufficient margins for protecting against aging or temperature related variations (as well as margins of tracking circuits) are detectable as failures before an actual bit error occurs. The in-situ setup violation detection circuits generate a warning signal in response to a detected failure so that a corrective action (such as raising the VDD level to enable slightly better margin) can be taken. Thus, the disclosed error-predicting system allows the actual operating voltage to be lowered to a level just above a level that would result in an actual error.

Figure 2:
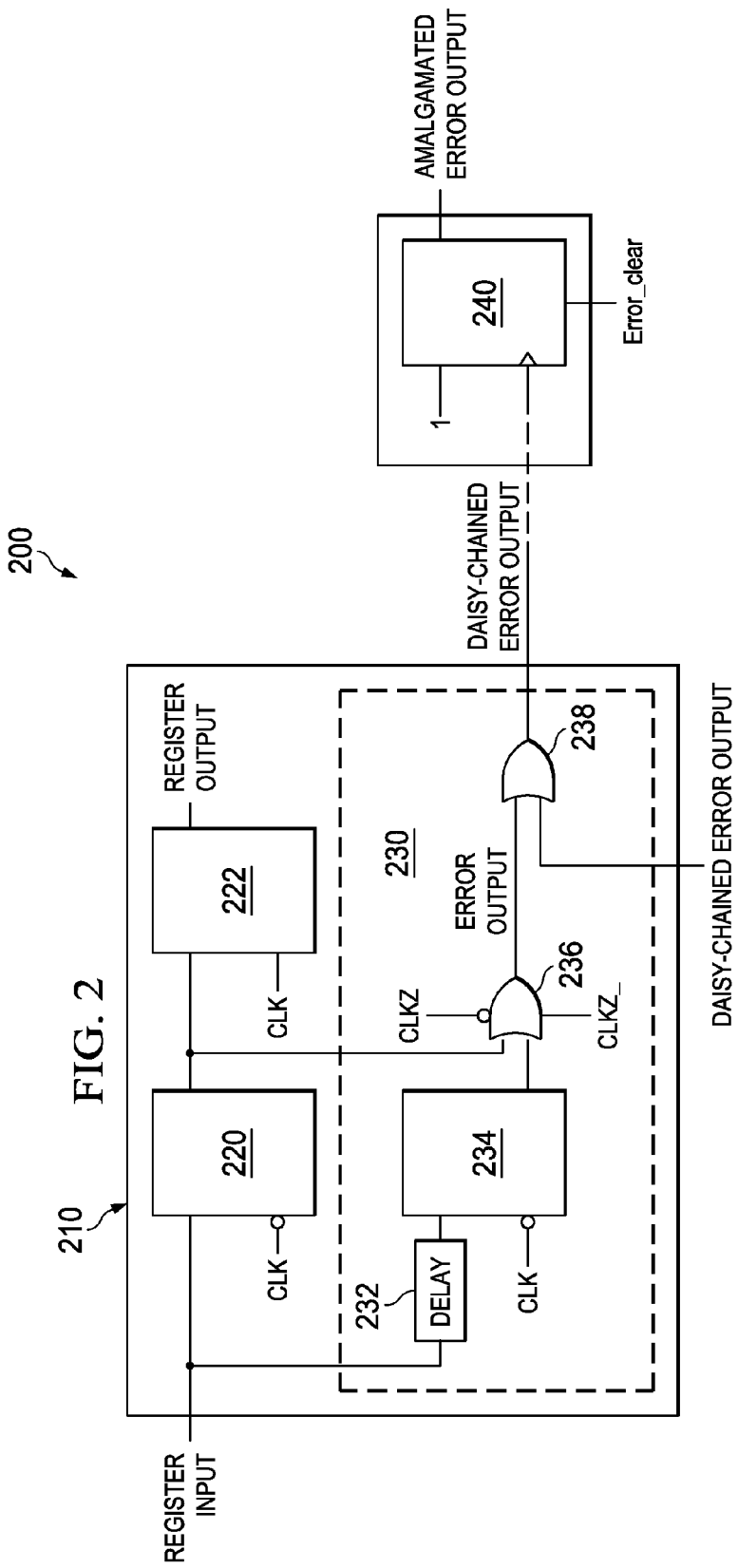
FIG. 2 is a logic diagram illustrating an error-predicting system that includes an error-predictive latch in accordance with embodiments of the disclosure.

FIG. 2 is a logic diagram illustrating an error-predicting system 200 that includes an error-predictive latch in accordance with embodiments of the disclosure. Error-predicting system 200 includes an error-predictive latch 210 that is coupled to a register input signal and provides a register output signal. The register input signal is latched by latch 220 in response to a first transition of a clock signal, whereas the output of latch 220 is latched by latch 222 in response to a second transition of the clock signal.

Failure of proper latching by latch 220 (resulting from a setup violation, for example) when operating at lower operating voltages is predictable by error-predictive circuit 230. For example, error-predictive circuit 230 includes a delay circuit 232 that is arranged to shorten the setup time available for latching the register input signal at latch 234. The latch 234 is typically implemented using an arrangement similar to the arrangement of latch 220 such that latch 220 and latch 234 both exhibit similar operating characteristics. Thus, as the operating voltage is reduced (as in during AVS system tuning), latch 234 (having a setup time similar to—but shorter than—the setup time of latch 220) typically fails (while latching the register input signal during the first transition of the clock signal due to a setup time violation) before latch 220 would fail to latch the register input signal.

The failure of latch 234 to a properly latch the register input signal is detected by comparing the output of latch 220 with the output of latch 234. Logic gate 236 is arranged to compare the output of latch 220 with the output of latch 234 (when the clock signal is, for example, at a logic level attained after the second transition of the clock signal, such as discussed below with reference to FIG. 7 and FIG. 8) and to determine an error when the output of latch 220 and the output of latch 234 are different.

To minimize module input-output connections, the error output of error-predictive latch 210 is combined with an error output of another error-predictive latch 210. In the example, the error output signal is logically-ORed with the daisy-chained error output from another error-predictive circuit 230 to produce another daisy-chained error output. The last daisy-chained error output is coupled to latch 240 such that the first transition of the daisy-chained error output signal results in latch 240 latching the detected error. The detected error is provided as an amalgamated (top-level) error output. Latch 240 is cleared in response to an error-clear signal. (The error-clear signal can be asserted by a system controller that is arranged to select and adjust operating voltages for the system in response to errors detected by an error-predictive latch 210).

Figure 3:
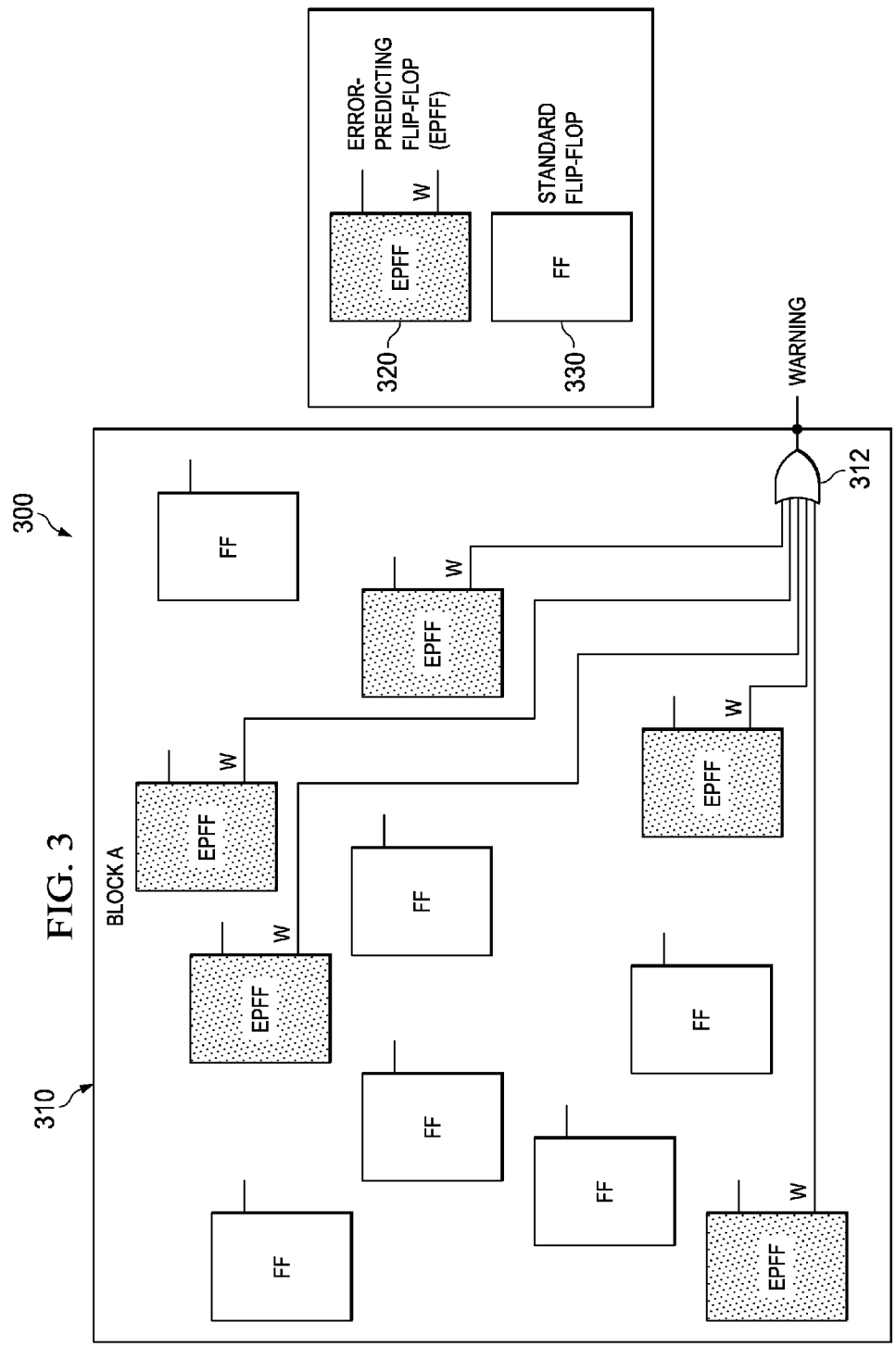
FIG. 3 is a logic diagram illustrating an error-predicting system that includes error-predictive latch in accordance with embodiments of the disclosure.

FIG. 3 is a logic diagram illustrating an error-predicting system 300 that includes error-predictive latch in accordance with embodiments of the disclosure. Error-predicting system 300 includes memory elements such as error-predicting flip-flops (EPFFs) 320 and (standard) flip-flops 330 in a logic circuit 310. Each of the EPFFs 320 is coupled to a register input signal and provides a register output signal. The register input signal of each EPFF is latched by a first internal latch in response to a first transition of a clock signal, and by a second internal latch in response to a second transition of the clock signal. (Clocking signals are not shown for simplicity.)

Likewise, each of the EPFFs 320 includes an error-predictive circuit such as error-predictive circuit 230 that (each) outputs an error signal when a third internal latch (such as latch 324 being coupled to delay circuit 322) fails to latch a delayed register input signal properly. Each of the EPFFs 320 provides an output warning (W) signal in response to the determination that the third internal latch (such as latch 324 being coupled to delay circuit 322) fails to latch a delayed register input signal properly. Logic gate 312 is arranged to receive each of the output warning signal from the EPFFs 320 and to provide a composite warning signal when one or more of the received output warning signals indicates a detected error of the third internal latch value. The system controller (see FIG. 4, for example) is arranged to receive a composite warning signal from various logic blocks and is arranged to independently adjust an operating voltage and/or an operating parameter of each logic block that generates a received composite warning signal.

Figure 4:
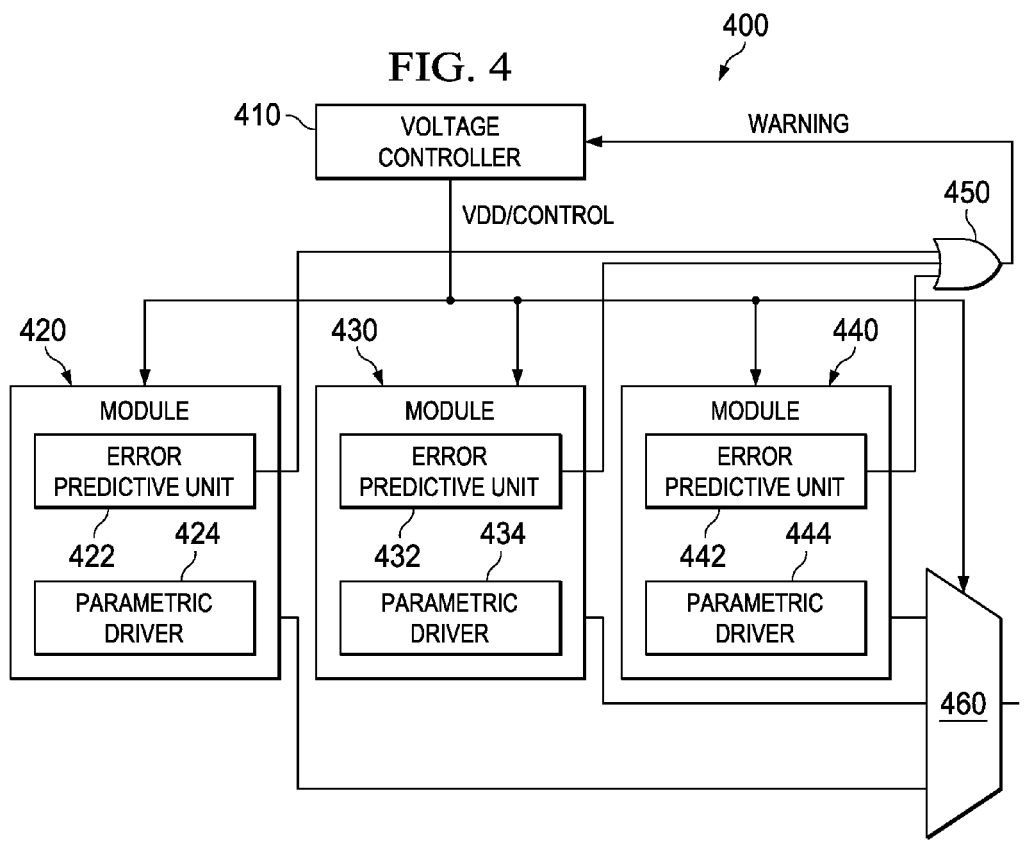
FIG. 4 is a logic diagram illustrating an error-predicting system that includes parametric drivers in accordance with embodiments of the disclosure.

FIG. 4 is a logic diagram illustrating an error-predicting system 400 that includes parametric drivers in accordance with embodiments of the disclosure. Error-predicting system 400 includes a voltage controller 410 is arranged to independently (or collectively) select and to generate an operating voltage for module 420, module 430, and module 440. Each of the modules 420, 430, and 440 can be a logic and/or a memory module. Module 420 includes, for example, error predictive unit 422 and parametric driver 424. Module 430 includes, for example, error predictive unit 432 and parametric driver 434. Module 440 includes, for example, error predictive unit 442 and parametric driver 444. Error predictive units 422, 432, and 442 are adjustable error-predictive circuits such as error-predictive circuit 230, wherein a parameter (such as delay 232) is adjustable to detect an operating error that occurs in response to the adjusted parameter.

Each of the modules 420, 430, and 440 outputs an output warning signal in response to a predictive operating error being detected by a respective error-predictive unit. As discussed below with reference to FIG. 5, predictive operating errors are determined in response to the change and an adjustable electrical operating parameter such as an operating voltage, drive strength, delay amount, output capacitance, and the like.

The output warning signals are coupled to a respective input of logic gate 450, which is arranged to generate a composite warning signal when one or more of the received output warning signals indicates a detected predictive latching error by a respective error-predictive unit. The composite warning signal is coupled to voltage controller 410. The composite warning signal optionally conveys information that includes an indication of a logic block from which the output warning signal has been generated and/or an indication of the kind of predictive operating error that has been detected.

In response to receiving a composite warning signal, the voltage controller 410 adjusts an operating parameter. For example, voltage controller 410 adjusts the operating voltage of a logic block in which the predictive operating error was detected. The voltage controller 410 also typically adjusts an operating parameter within the parametric driver in one or more of the logic blocks. For example, voltage controller 410 adjusts the output voltage of a parametric driver of a logic block in response to the logic block and the kind of detected predictive operating error (such as a setup delay) indicated by the received composite signal.

An output signal is generated from each parametric driver (424, 434, and 444) in response to an operating parameter (such as a minimum operating voltage) selected by voltage controller 410. Each output signal generated from each parametric driver is coupled to an input of multiplexer 460. Voltage controller 410 is arranged to select which multiplexer input is to be coupled to the output of multiplexer 460. Accordingly, a logic block can be identified as having a higher probability of failure and functionally replaced through using selected redundant logic blocks. In various embodiments, the parametric drivers have parametrically controlled outputs that are coupled to the inputs of addressable (e.g., selected) circuit components (e.g., not necessarily multiplexers per se).

Figure 5A:
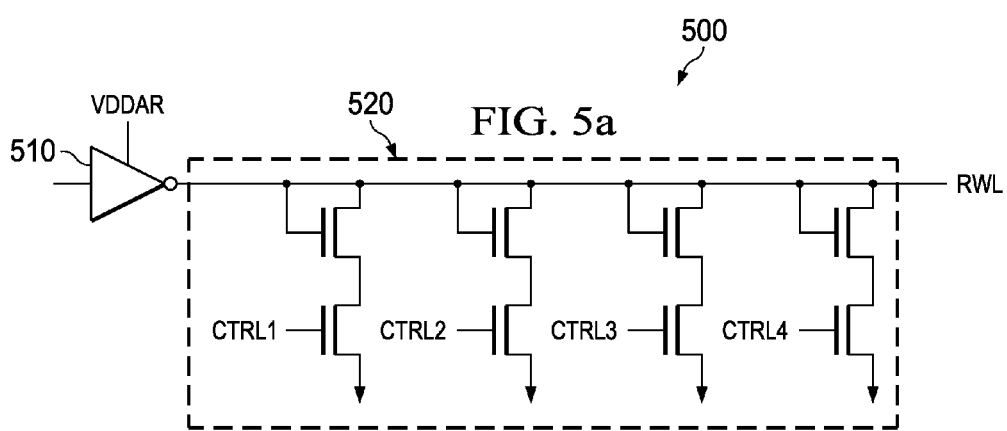

FIGS. 5a, 5b, and 5c are schematic diagrams illustrating various parametric drivers in accordance with embodiments of the disclosure. The operation of the various parametric drivers is discussed below with reference to FIG. 9 and FIG. 14.

Figure 6:
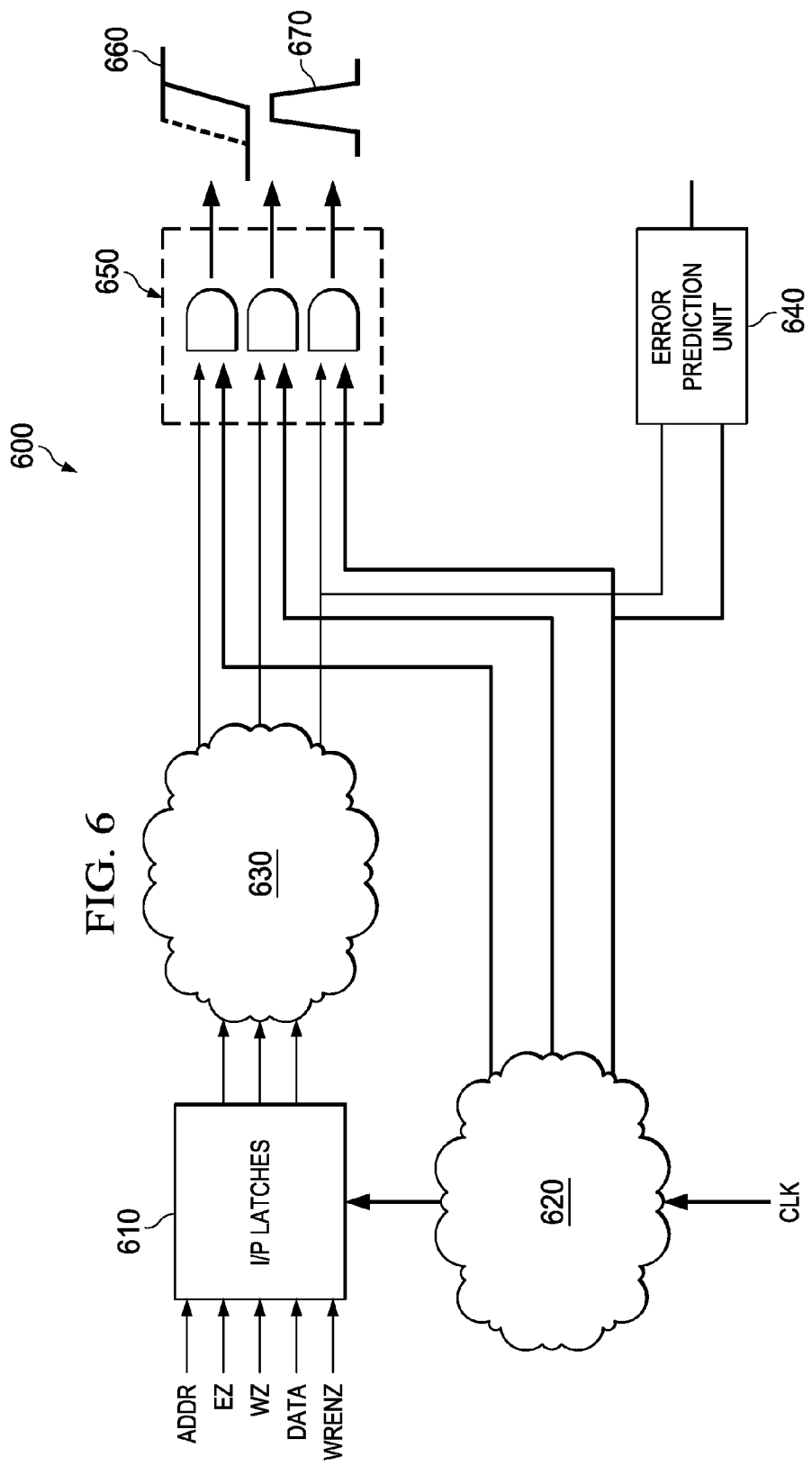
FIG. 6 is a schematic diagram illustrating a memory-to-logic interface of an error-predicting system in accordance with embodiments of the disclosure.

FIG. 6 is a schematic diagram illustrating a memory-to-logic interface of an error-predicting system in accordance with embodiments of the disclosure. System 600 is arranged to detect for setup timing violations in a logic path at a memory-to-logic (and/or logic-to-memory) interface. (As discussed above, such setup timing violations occur much more frequently when the circuitry is operating at lowered operating voltages and/or at operating "corner" conditions.

The setup timing violations in a logic path could result in single or multiple bits failure based on the amount of violation. While the illustrated embodiment involves logic-to-memory and memory-to-logic periphery interface paths (such as formed by logic circuits 620 and 630 respectively), other embodiments of operating error prediction include testing for setup timing violations in logic paths that might not be exposed to static timing analyses and critical path methods.

System 600 includes a memory element such as I/P (input) latches 610. The I/P latches 610 can be transparent latches or registers, which optionally include error-predicting flip flops. The I/P latches 610 are coupled to bus that includes address (ADDR), enable (EZ), write (WZ), data, and write enable (WRENZ). The I/P latches 610 are arranged to receive clocking signals from logic circuit 620 which are used to trigger the latching of data signals that are input to the I/P latches 610. The data outputs of the data latched in the I/P latches 610 are coupled to logic circuit 630. The outputs of logic circuit 630 are coupled to clock gates 650. (The clock gates are normally only operative when the clock is either high or low as discussed below with reference to FIG. 7 or FIG. 8.) Error prediction unit 640 is optional as discussed below.

In operation, the input data is captured by the I/P latches 610 at a first edge of a clock (such as the rising edge) and held during a complete cycle of the clock. When the I/P latches 610 are registers (that do not include error-prediction flip-flops), the input setup time is evaluated at the interface of the input registers that arranged at the boundary (e.g., periphery) of the logic-to-memory interface. Thus, a setup violation (at the rising edge of the clock, for example) where an input is latched incorrectly results in an incorrect value being propagated through logic circuit 630. The incorrect value is detectable at the interface boundary at which clock gates 650 are arranged, for example. The incorrect value is detected by clock gates 650 using a comparison signal from logic circuit 620 to compare with one or more outputs of I/P latches 610 as propagated through logic circuit 630. Thus, in designs where the input data is propagated through a register, the setup timing is determined at the boundary point. In this case, regular input registers can be replaced with EPFF to detect errors and generate warning signals in response to the detected errors. In designs where the input data is propagated through a latch, the setup is determined at the point further down the logic chain at the point where data "meets" the clock. In this case, the error prediction unit is placed at the point of interaction of the data with clock to generate warning signals.

In an embodiment, the registers incorporating error-prediction flip-flops are similar to having two registers with a first register having a delayed input and a XOR-based passthrough logic that is arranged to generate an error signal. The EPFF thus allows the error-prediction circuitry to be incorporated in critical paths at design time, which shortens design cycle times and provides a standardized approach to reducing operating voltage guard bands.) Thus, the setup time calculation (e.g., evaluated by progressively lowering an operating voltage and determining whether the register correctly latched the input using the "stressed" conditions) accurately determines the response of the latching circuit (without intervening circuitry such as logic circuit 630) to the "stressed" inputs.

When the latching circuit has a design that is similar to the latching circuit of the error-prediction flip-flop, the setup time calculation even more accurately measures the point at which the latching circuitry would begin to fail (which allows for a smaller guard band for an actual operating voltage). Thus, a setup violation is detected without the variations in the propagation in an incorrect value being propagated through logic circuit 630 and without the variations induced by clock gates 650 using a comparison signal from logic circuit 620 to compare with one or more outputs of I/P latches 610 as propagated through logic circuit 630.

When the I/P latches 610 are latches (such as transparent latches that do not include error-prediction flip-flops), the input setup time is also evaluated at the interface of the input registers that arranged at the boundary (e.g., clock gates 650) of the logic-to-memory interface. For example, the I/P latches 610 are transparent while the input clock remains low and then latched when the clock transitions high. Thus, a setup violation (at the rising edge of the clock, for example) where an input is not-quite latched and/or transmitted incorrectly results in an incorrect value being propagated through logic circuit 630. The incorrect value is detectable at the interface boundary at which clock gates 650 are arranged, for example, and is manifested as a delayed output 660 or a "glitch" 670.

An error-prediction unit 640 is also arranged to detect an input setup violation by monitoring the output of logic circuit 630 (at the boundary of the logic-to-memory interface). In contrast to the clock gates 650, the error prediction unit 640 is arranged to detect a failure of a latch to hold a latched value within a single clock period. For example, the error prediction unit operates in response to a negative transition of the clock (as discussed in FIG. 7 below) or in response to a positive transition of the clock (as discussed in FIG. 8 below). Thus, the setup time calculation (e.g., evaluated by progressively lowering an operating voltage and determining whether the register correctly latched the input using the "stressed" conditions) accurately determines the response of the latching circuit (which allows for a reduced guard band for avoiding actual errors when operating at an actual operating voltage).

Figure 7:
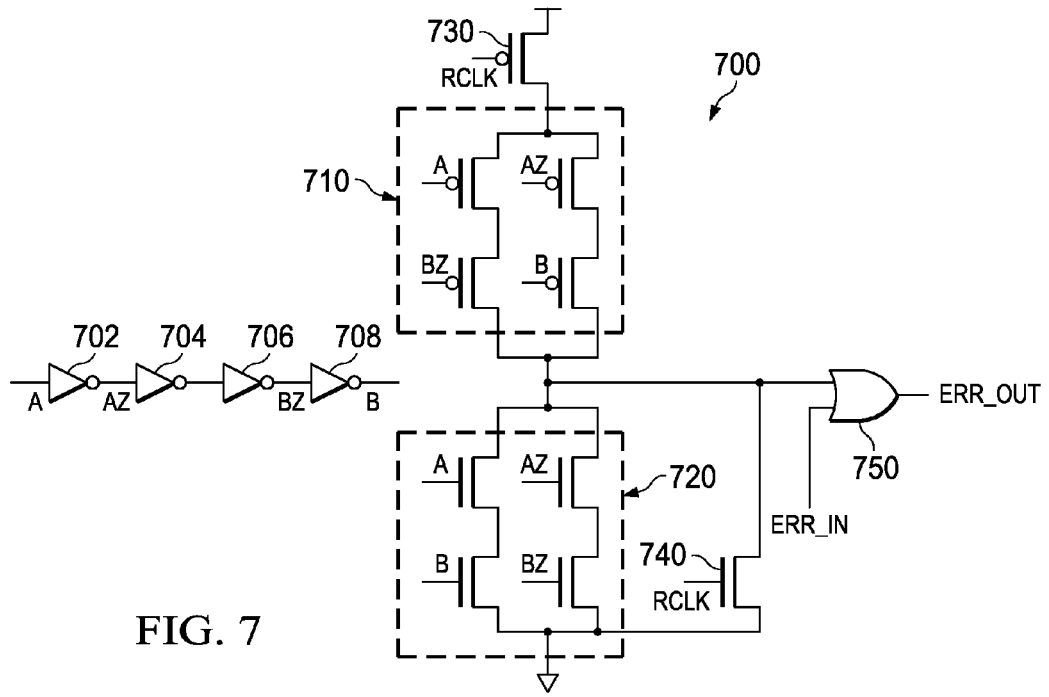
FIG. 7 is a schematic diagram that illustrates a logic OR/NOR-based error prediction unit in accordance with embodiments of the disclosure.

FIG. 7 is a schematic diagram that illustrates a logic OR/NOR-based error prediction unit in accordance with embodiments of the disclosure. Error prediction unit 700 includes an input delay line that includes a series of inverters (802, 704, 706, and 708) that is arranged to produce a delayed version (one or more of signals AZ, BZ, and B) of the data input (signal A). Both the original input (signal A) and the delayed version (one or more of signals AZ, BZ, and B) are applied to pull-up network 710 and to pull-down network 720 so that the delayed version of the input is compared with the (non-delayed version of the) input to determine a transition after the latching of the data (signal A) as discussed below.

When the error prediction unit 700 is coupled to the data output of a transparent latch that latches data using a falling edge (for example) of a register clock (RCLK), the data output is stable (with A equaling B and with AZ equaling BZ) after the falling edge of RCLK (in normal operation). Thus transistor 740 is turned on when RCLK is high, which forces the first input of OR-gate 750 to be low (which indicates the lack of a detected error).

When RCLK transitions low, transistor 730 is turned on which applies power to the pull-up network 710. When a transition (if any) occurs in (input) signal A when RCLK is low, a propagation delay from inverters 702, 704, and 706 momentarily activates the signal A-gated PMOS (p-type-metal-oxide-semiconductor) transistor and the signal BZ-gated PMOS transistor, which momentarily forces the first input of OR-gate 750 to be high (which indicates the detection of an error). Likewise (one inverter-delay later), the propagation delay from inverters 704, 706, and 708 momentarily activates the signal AZ-gated PMOS transistor and the signal B-gated PMOS transistor, which also momentarily forces the first input of OR-gate 750 to be high (which indicates the detection of an error). When the change in the input signal is fully propagated through the input delay line, either the first leg (A- and B-gated NMOS—n-type-metal-oxide-semiconductor—transistors) or the second leg (AZ- and BZ-gated NMOS transistors) is activated and dumps (e.g., shunts) the capacitive charge to ground, thus quickly restoring the first input of OR-gate 750 to indicate the lack of an error.

Thus any change in the input signal A after RCLK transitions low (which indicates the latch did not successfully latch the propagated data input and that the setup time was violated), is detected and coupled to the first input of OR-gate 750. The error input (ERR-IN) that is coupled to the second input of OR-gate 750 is coupled from the error output of another error prediction unit 700 such that an amalgamated errors signal (e.g., ERR-OUT) is output by OR-gate 750. As discussed above, the amalgamated errors signal is used to determine a guard band for an actual operating voltage that is determined, for example, (in part, at least) by successively lowering a test operating voltage until a setup error is encountered and the amalgamated error signal is asserted.

Figure 8:
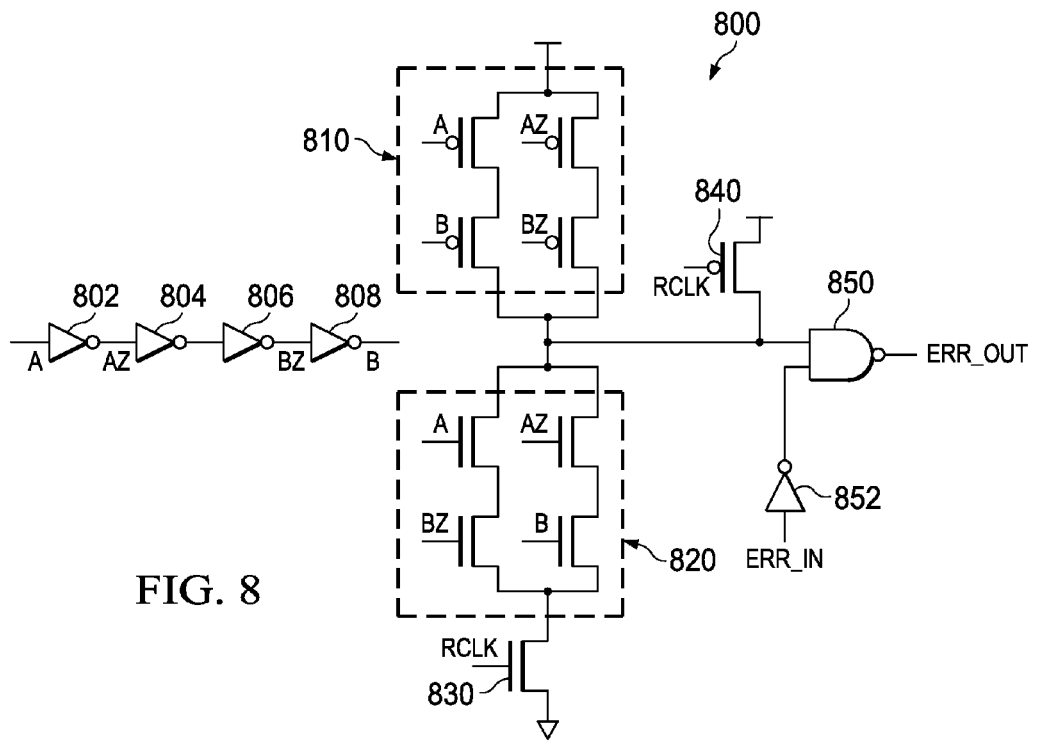
FIG. 8 is a schematic diagram that illustrates a logic AND/NAND-based error prediction unit in accordance with embodiments of the disclosure.

FIG. 8 is a schematic diagram that illustrates a logic AND/NAND-based error prediction unit in accordance with embodiments of the disclosure. Error prediction unit 800 includes an input delay line that includes a series of inverters (802, 804, 806, and 808) that is arranged to produce a delayed version (one or more of signals AZ, BZ, and B) of the data input (signal A). Both the original input (signal A) and the delayed version (one or more of signals AZ, BZ, and B) are applied to pull-up network 810 and to pull-down network 820 and so that the delayed version of the input is compared with the (non-delayed version of the) input to determine a transition after the latching of the data (signal A) as discussed below.

When the error prediction unit 800 is coupled to the data output of a transparent latch that latches data using a rising edge (for example) of a register clock (RCLK), the data output is stable (with A equaling B and with AZ equaling BZ) after the rising edge of RCLK (in normal operation). Thus transistor 840 is turned on when RCLK is low, which forces the first input of NAND-gate 850 to be high (which indicates the lack of a detected error when the ERR-IN signal coupled to the second input of NAND-gate 850 is low).

When RCLK transitions high, transistor 830 is turned on which applies power to the pull-down network 820. When a transition (if any) occurs in (input) signal A when RCLK is high, a propagation delay from inverters 802, 804, and 806 momentarily activates the signal A-gated NMOS transistor and the signal BZ-gated NMOS transistor, which momentarily forces the first input of NAND-gate 850 to be low (which indicates the detection of an error). Likewise (one inverter-delay later), the propagation delay from inverters 804, 806, and 808 momentarily activates the signal AZ-gated NMOS transistor and the signal B-gated NMOS transistor, which also momentarily forces the first input of NAND-gate 850 to be low (which indicates the detection of an error). When the change in the input signal is fully propagated through the input delay line, either the first leg (A- and B-gated PMOS transistors) or the second leg (AZ- and BZ-gated PMOS transistors) is activated, which thus quickly restores the first input of NAND-gate 850 to indicate the lack of an error.

Thus any change in the input signal A after RCLK transitions high (which indicates the latch did not successfully latch the propagated data input and that the setup time was violated), is detected and coupled to the first input of NAND-gate 850. The error input (ERR-IN) that is coupled to the second input of NAND-gate 850 is coupled from the error output of another error prediction unit 800 such that an amalgamated errors signal (e.g., ERR-OUT) is output by NAND-gate 850. As discussed above, the amalgamated errors signal is used to determine a guard band for an actual operating voltage that is determined, for example, (in part, at least) by successively lowering a test operating voltage until a setup error is encountered and the amalgamated error signal is asserted.

Figure 9:
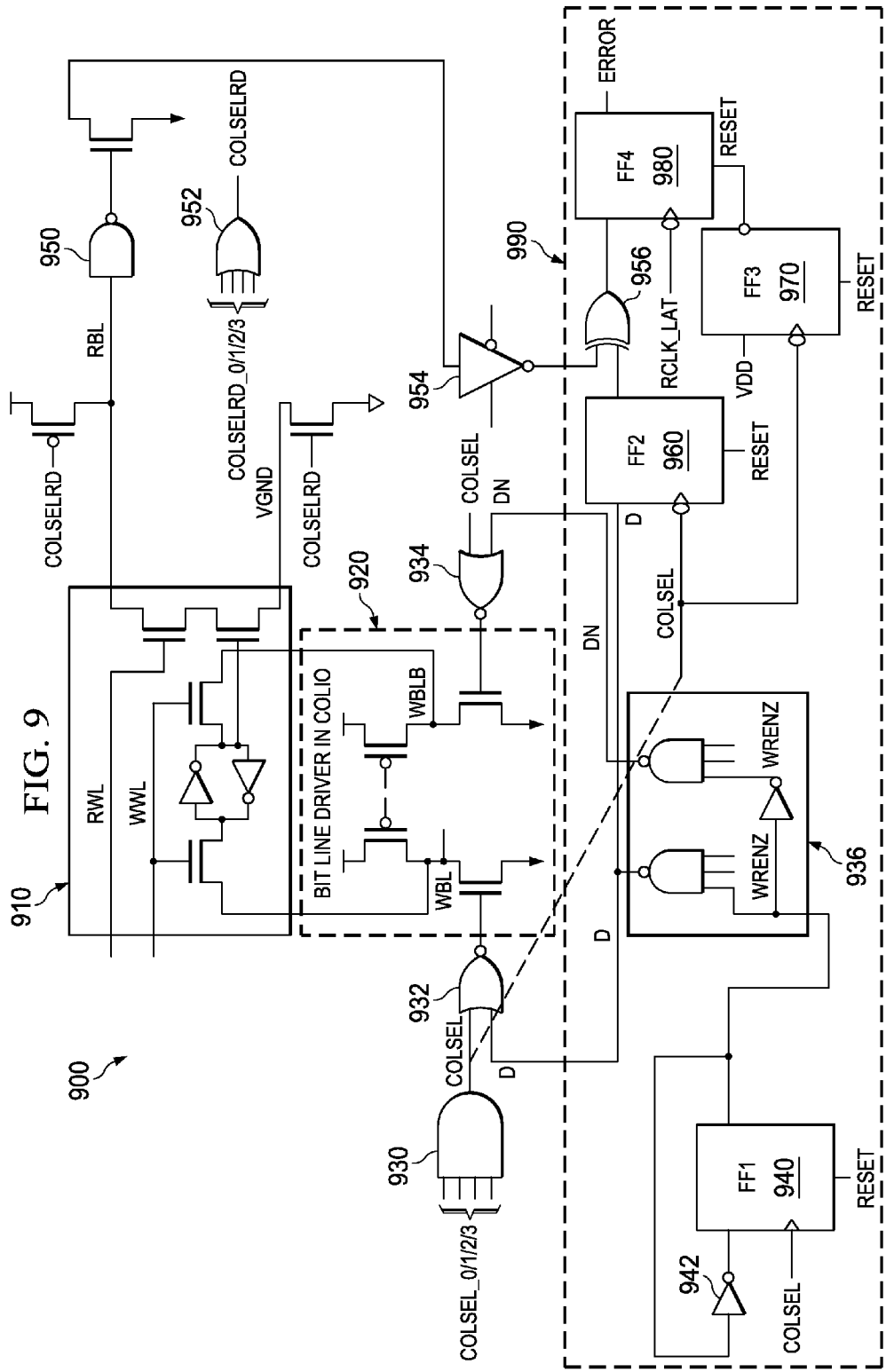
FIG. 9 is a schematic diagram that illustrates a replica eight-transistor memory cell for memory error prediction in accordance with embodiments of the disclosure.

FIG. 9 is a schematic diagram that illustrates a replica eight-transistor memory cell for memory error prediction in accordance with embodiments of the disclosure. Replica memory cell 900 includes a static RAM memory cell 910 having eight transistors. Memory cell 910 when the write word line (WWL) is high and read from when read word line (RWL) is high. FIG. 5a is schematic diagram illustrating a variable drive strength parametric driver in accordance with embodiments of the disclosure. Parametric driver 500 in an example embodiment is arranged to drive a read/write line of an addressable memory (such as RAM). Thus parametric driver 500 is arranged to reduce the RWL/WWL supply voltage. Reducing the word line (WL) supply voltage affects both the read mode and the write mode. In read mode, reducing the WL supply voltage reduces current ($I_{read}$) of the reference bit (bit under tracking). In write mode, reducing the WL supply voltage reduces the design margins allowed for ensuring a successful write operation. Reducing the WL is an example of a technique for reducing the electrical tolerances of the reference bit worse (e.g., such that the probability of the reference bit failing is greater than the probability of the functional bit failing).

Parametric driver 500 includes a driver (e.g., inverter) 510 and a drive-strength network 520. Driver 510 is powered by (power) signal VDDAR (array VDD) and has a drive-strength that varies as a function of VDDAR. Parametric driver 500 (as well as parametric drivers 540 and 560) is used to degrade the functionality of a reference bit cell so that the reference bit cell will likely fail before the actual functional bit cell produces a failure.

Another example of reducing the WL is by using a parametric driver for COLSEL (column select) gate 932. FIG. 5b is schematic diagram illustrating a variable delay parametric driver in accordance with embodiments of the disclosure. Parametric amplifier 540 is arranged to delay the of the write of the data into the memory cell by delaying the write driver enable signal. Delaying the "turn on" of the write buffer lessens the time available to write into the memory bit cell, thus selectively increasing the likelihood that the reference bit cell would fail.

Parametric driver 550 in an example embodiment is arranged as a column selector 540 of an addressable memory (such as RAM). The column selector 540 is arranged to drive the write bit line (WBL) when both output of the column selector 540 is high and the precharge (P) signal is high. Parametric driver 550 includes a logic gate 530 and a delay network 520. Logic gate 530 is arranged to generate an (inverted) column select signal. The (inverted) column select signal is coupled to an inverter/driver 552 that is arranged to generate a (non-inverted) column select signal (COLSEL) having a least amount of delay. The (inverted) column select signal is also coupled to a first delay circuit (DEL1) that is coupled in series with inverter/driver 554 that is arranged to generate a (non-inverted) column select signal (COLSEL) having a first delay that is longer than the least amount of delay generated by inverter 552. The (inverted) column select signal is also coupled to a second delay circuit (DEL2) that is coupled in series with inverter/driver 556 that is arranged to generate a (non-inverted) column select signal (COLSEL) having a second delay that is longer than the first delay. The (inverted) column select signal is also coupled to a third delay circuit (DEL2) that is coupled in series with inverter/driver 558 that is arranged to generate a (non-inverted) column select signal (COLSEL) having a third delay that is longer than the second delay.

The composite COLSEL has a delay that is selected by selectively applying power to selected inverters (for example, inverter 552, inverter 554, inverter 556, and/or inverter 558). In similar fashion as described in FIG. 5a, a controller (such as voltage controller 410) is arranged to select an operating voltage for the parametric driver and to select one or more of the inverters. Selecting one or more of the inverters individually selects each "leg" of the delay network to select a composite delay of the parametric driver. The delay circuits in each leg can be selected to have different sizes (such as a geometric progression) so that the delay can be finely adjusted using a range of binary values, for example.

In "split rail" (e.g., having a first power supply for the memory cells and a second power supply that is adjustable independently of the first power supply) systems, the periphery logic is tested independently of the memory cell power supply. The periphery logic is tested independently of the memory cell power supply by placing error detection and warning generation in periphery logic. Accordingly, setup paths in the memory are testable using parametric drivers. In contrast, single power supply systems (or in split rail memory systems having a periphery supply and an array supply that is also lowered to minimum possible limit) can be more simply tested using a lowered operating supply and disclosed devices such as the EPFF.

The drive-strength network can also be used, for example, in place of the delay circuit 232 (referenced above with respect to FIG. 2), to form an error-predictive circuit that is sensitive to a degraded drive-strength. A predictive operating error occurs when the latch having an input that is adjusted by an operating parameter fails to latch the same value as a latch coupled to the (unadjusted) input. In this case, a latch having a delay adjustment control is used for error detection ("replica path") and a latch without the delay adjustment control is used in normal functional paths. Accordingly, the drive-strength network is used to make the replica path less electrically tolerant (with respect to the normal functional path) and thus making the replica path fail before functional path in the case of setup timing degradation (which can occur due to aging, temperature variation, and operating voltage droop). Thus, both the operating voltage and the input adjustment parameter can be adjusted to predictively determine an operating error. The operating voltage (used in normal operation, for example) can be selected in response to both the detection of the error and the selected drive strength used at the time the predictive operating error occurred. With reference again to FIG. 9, the values of write bit line signal (WBL) and the write bit line complement (WBLB) are written to memory cell 910 when the write word line (WWL) is high. Bit line driver in column input/output (COLIO) 920 includes complementary drivers for driving signals WBL and WBLB. Signal WBL is generated in response to a comparison of signal D (data) generated by state machine 990 and signal COLSEL (column select) by gate 932, whereas signal WBLB is generated in response to the comparison by gate 934 of signal DN (data negated) generated by state machine 990 and signal COLSEL. Signal COLSEL is generated by gate 930 in response to bus COLSEL signals 0, 1, 2, and 3 (COLSEL_0/1/2/3).

The value of memory cell 910 is read via signal read bit line (RBL) when signal read word line (RWL) is high. Signal RBL is precharged when signal column select read (COLSELRD) is low. Signal COLSELRD is generated by gate 952 in response to bus COLSELRD signals 0, 1, 2, and 3 (COLSELRD_0/1/2/3). Signal virtual ground (VGND) is used to discharge the charge on signal RBL when COLSELRD is low and in response to one of two stored values in the memory cell 910. Signal RBL is buffered by inverter 950 as well as tri-state inverter 954 such that the output of memory cell 910 is selectively verified by the state machine 990.

State machine 990 includes a complementary driver 936 that is arranged to drive the signals D and DN in response to signal WRENZ and the output of flip-flop 1 (FF1) 940. FF1 940 is arranged to generate values for signals D and DN that toggle at (for example) every rising edge of COLSEL. Signal reset (RESET) is arranged to reset the flip flops (940, 960, 970, and 980) in the state machine 990. Flip-flops 960, 970, and 980 are arranged to verify the output of memory cell 910 as discussed below with reference to FIG. 10.

Figure 10:
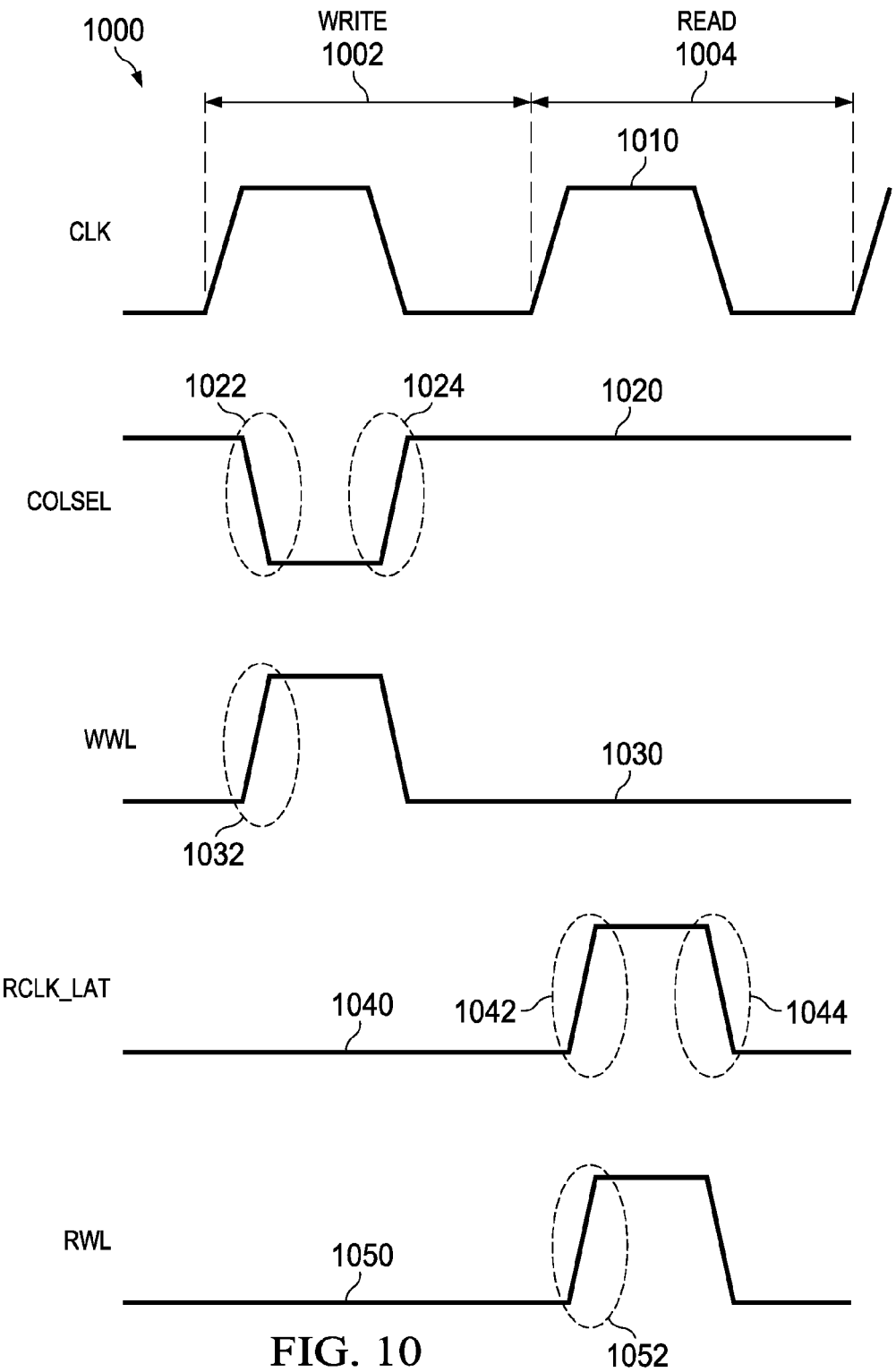
FIG. 10 is a signal diagram illustrating waveforms of a replica eight-transistor memory cell for memory error prediction in accordance with embodiments of the disclosure.

FIG. 10 is a signal diagram illustrating waveforms of a replica eight-transistor memory cell for memory error prediction in accordance with embodiments of the disclosure. Waveform diagram 1000 illustrates a clock (CLK) signal having a write period 1002 and a read period 1004. During the write period 1002, signal COLSEL 1020 has a falling transition 1022 (in response to the rising edge of CLK) and a rising transition 1024 (in response to the falling edge of CLK). Also during the write period 1002, signal WWL 1030 has a rising transition 1032 (in response to the falling edge of COLSEL 1020).

At rising transition 1032, memory cell 910 is written to using the signal D, which is the propagated value of FF1 940. At every rising edge 1024 of COLSEL 1020, the value of signal D is toggled by FF1 940. At the falling edge 1022 of COLSEL 1020, a first value (the current state resulting from the reset signal being asserted, for example) of D is latched into FF2 (flip-flop 2) 960. The first value of D is also latched in the memory cell 910, when signal WWL 1030 goes low (such that the value of signal D is latched by memory cell 910 via the drive strength of the cross-coupled inverters). Also at the falling edge 1022 of COLSEL 1022, the value of FF3 (flip-flop 3) 970 is set to a logic one (which is the opposite value of the reset state) so that the RESET signal of FF4 (flip-flop 4) 980 is held to a non-reset state. Accordingly, FF4 980 is reset when signal RESET is asserted, and only before the first falling edge 1022 of COLSEL 1020 that occurs after the RESET signal is de-asserted. Thus, FF4 980 is arranged to latch the result of a comparison of the first read (after reset) of the memory cell 910 with the first value that is latched in FF2 960.

Memory cell 910 is read during read period 1004. The rising edge of CLK 1010 during read period 1004 causes rising edge 1042 of signal RCLK_LAT 1040, which in turn causes the rising edge 1052 of read word line (RWL) 1050. As discussed above, the rising edge 1052 of RWL 1050 enables the reading of the read bit line (RBL, which is the value stored by the memory cell 910) via inverter 950 as well as tri-state inverter 954 (which is enabled when RWL is active high). When the read value of the RBL is different than the first value that is latched in FF2 960 (as determined by eXclusive-OR gate 956), an error condition is determined. When the error condition is determined, the indication of the error (generated by XOR-gate 956), the indication of the error is latched by FF4 980 in response to the falling edge 1044 of RCLK_LAT 1040.

The replica eight-transistor memory cell allows "tuning" of memory cell by functionally testing the replica memory cell over a range of voltages to determine a voltage at which the replica cell begins to produce errors. The voltage at which the replica cell begins to produce errors can be determined by a linear search (where for example a test operating voltage is gradually decreased each test until a failure is encountered) or by a binary search (where for example the test operating voltage is increased by half of the difference of the current operating voltage and the previous operating voltage when an error is encountered and the test operating voltage is decreased by half of the difference of the current operating voltage and the previous operating voltage when an error is not encountered).

The reduced voltage test on the replica is used to provide an actual basis from which to estimate the effects of operation at reduced voltages on all bit cells and accompanying logic. For example, the effects of lower operating voltages upon control, precharge, initialization, writing, and reading, sensing operations, and the like are evaluated using the replica memory cell and determining the minimum operating voltage at which errors start to be encountered. The empirically determined value for a minimum operating voltage is, for example, adjusted upwards by a factor that is preselected to preserve power and to maintain a desired degree of confidence that no error will likely occur. The factor can be specified as an absolute value or a percentage and can be selected by a user with respect to the criticality of the application of the system and the probability of failure of the device that the replica circuit is used to predict performance.

The replica path is tuned (for example, "stressed") in order to ensure that the replica cell gives out an error warning before a bit in the actual (functional) bit cells would fail. Various critical paths are tuned so as to provide error predictions based on the tuned path in the replica memory cell. For example, the WL can be tuned by using a parametric driver to "stress" the WL line with an increased delay, tristated driver can be tuned with an increased delay, and/or the delay logic tuning in the global read bit line path tuned.

In various embodiments, multiple replica memory cells are included with different replica memory cells being used to test different critical paths. For example, the pulse width of a write operation can be tuned by adjusting electrical parameters using at least three different approaches. In a first approach, the value of signal WWL is suppressed by using a circuit such the circuit of FIG. 5a where individual transistors control diode-drops in voltage for the output signal. In a second approach, the value of WBL and/or WBLB is increased by using a switch diode arranged similar to FIG. 5a except that PMOS transistors are used to incrementally pull the value up to the positive power supply rail. In a third approach, the COLSEL signal is selectively delayed by using a circuit such as the circuit illustrated in FIG. 5b. Thus, the three approaches can be used collectively or singly in a different combination to test write operations in each of several replica memory cell circuits.

Also, for example, the pulse width of a read operation can be tuned by adjusting electrical parameters using at least three different approaches. In a first approach, the value of signal RWL is suppressed by using a circuit such the circuit of FIG. 5a where individual transistors control diode-drops in voltage for the output signal. In a second approach, the value of the strength of tri-state 954 is tuned by adding and/or removing parallel PMOS and/or NMOS transistors using control signals. In a third approach, the output of the tri-state 954 is selectively delayed by using a circuit such as the circuit illustrated in FIG. 5b. Thus, the three approaches can be used collectively or singly in a different combination to test read operations in each of several replica memory cell circuits.

Figure 11:
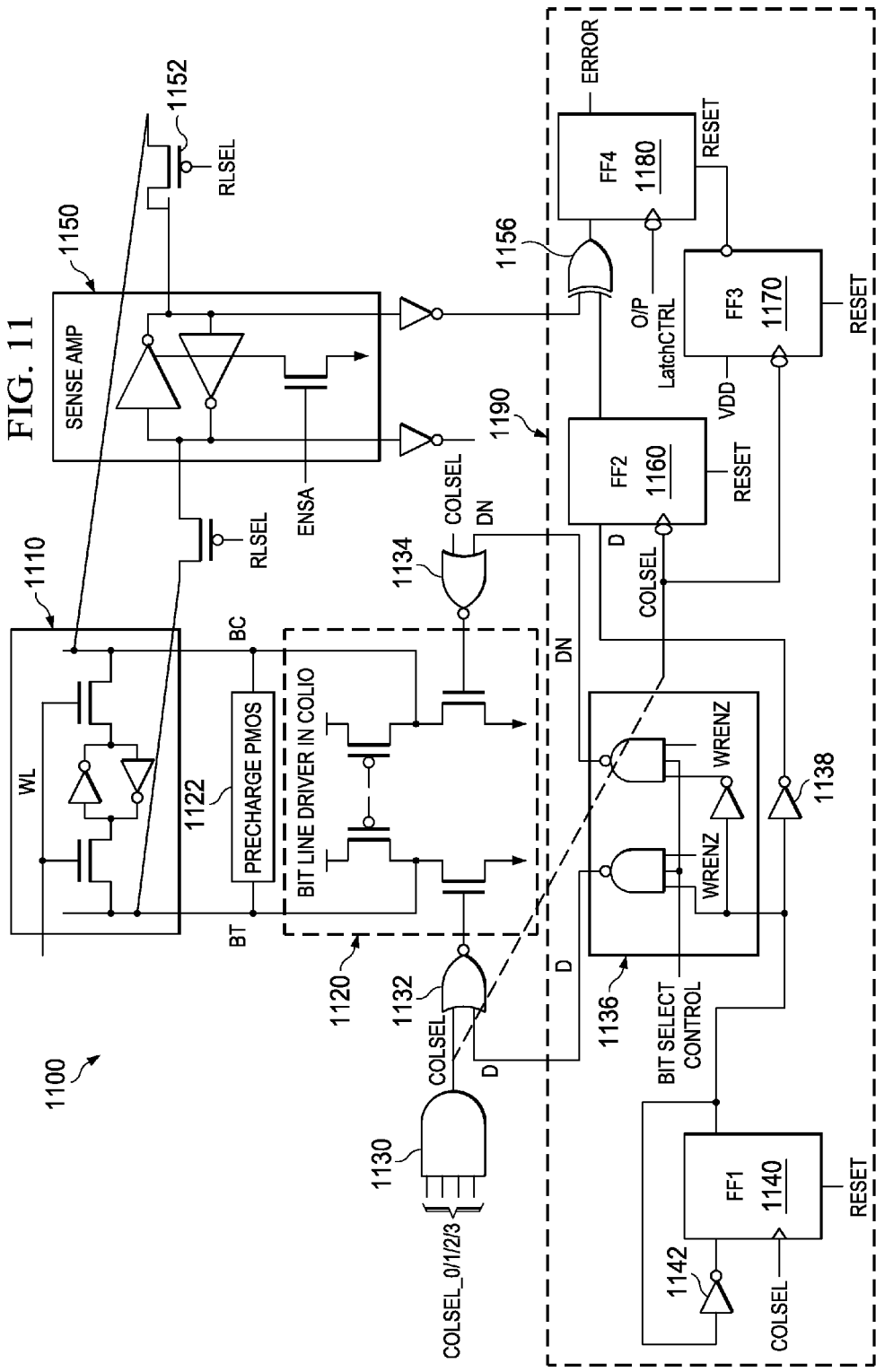
FIG. 11 is a schematic diagram that illustrates a replica six-transistor memory cell for memory error prediction in accordance with embodiments of the disclosure.

FIG. 11 is a schematic diagram that illustrates a replica six-transistor memory cell for memory error prediction in accordance with embodiments of the disclosure. Replica memory cell 1100 includes a static RAM memory cell 1110 having six transistors.

The values of bit true (BT) signal and the bit complement (BC) are written to memory cell 1110 when the word line (WL) is high. Bit line driver in column input/output (COLIO) 1120 includes complementary drivers for driving signals BT and BC. Signal BT is generated in response to a comparison by gate 1132 of signal D (data) generated by state machine 1190 and signal COLSEL (column select), whereas signal BC is generated in response to a comparison of gate 1134 of signal DN (data negated) generated by state machine 1190 and signal COLSEL. Signal COLSEL is generated by gate 1130 in response to bus COLSEL signals 0, 1, 2, and 3 (COLSEL_0/1/2/3).

The value of memory cell 1110 is read using sense amp 1150 when transistors 1152 are turned on when the signal read line select (RLSEL) is low. Signals BT and BC are precharged by precharge PMOS 1122 transistors. Signal RLSEL is forced low in response to a clock signal going high during a read period (as discussed below with respect to FIG. 12). The sense amp 1150 is enabled by signal enable sense amp (ENSA) after the signal RLSEL is forced low. The output of the sense amp 1150 is coupled to XOR-gate 1156 such that the output of memory cell 1110 is selectively verified by the state machine 1190.

State machine 1190 includes a complementary driver 1136 that is arranged to drive the signals D and DN in response to signal WRENZ, bit select control, and the output of flip-flop 1 (FF1) 940. FF1 940. Flip-flop 1 (FF1) 1140 is arranged to generate values for signals D and DN that toggle at (for example) every rising edge of COLSEL. Signal reset (RESET) is arranged to reset the flip flops (1140, 1160, 1170, and 1180) in the state machine 1190. Flip-flops 1160, 1170, and 1180 are arranged to verify the output of memory cell 1110 as discussed below with reference to FIG. 12.

Figure 12:
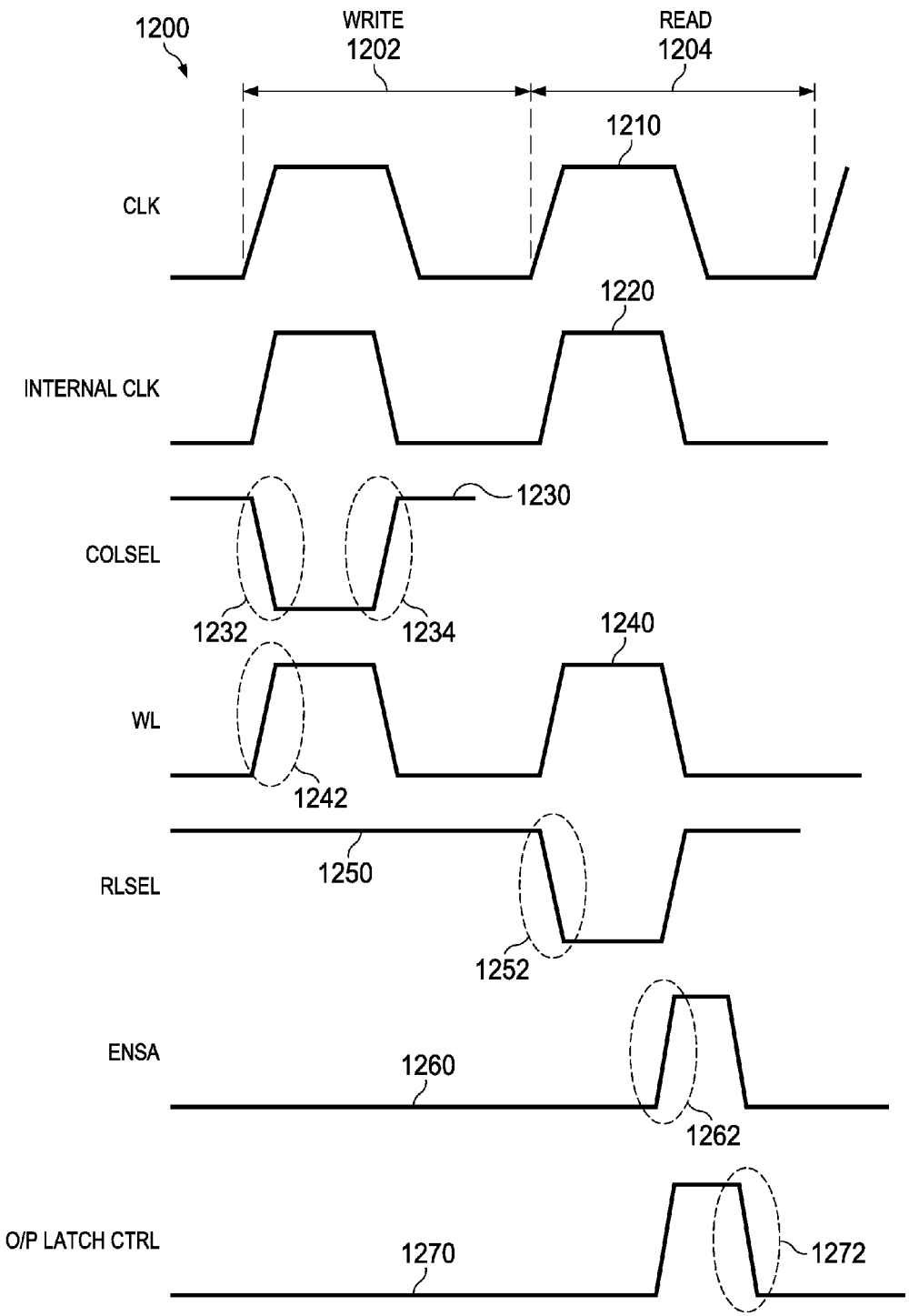
FIG. 12 is a signal diagram illustrating waveforms of a replica six-transistor memory cell for memory error prediction in accordance with embodiments of the disclosure.

FIG. 12 is a signal diagram illustrating waveforms of a replica six-transistor memory cell for memory error prediction in accordance with embodiments of the disclosure. Waveform diagram 1200 illustrates a clock (CLK) signal having a write period 1202 and a read period 1204. Internal clock (INTERNAL CLK) 1220 signal is generated in response to the CLK signal and has a shortened pulse width with respect to the positive portion of the CLK duty cycle. During the write period 1202, signal COLSEL 1230 has a falling transition 1232 (in response to the rising edge of CLK) and a rising transition 1234 (in response to the falling edge of INTERNAL CLK 1220). During both write period 1202 and the read period 1204, signal WL 1240 has a rising transition 1242 (in response to the rising edge of INTERNAL CLK 1220).

At rising transition 1242, memory cell 1110 is written to using the signal D, which is the propagated value of FF1 1140. At every rising edge 1234 of COLSEL 1230, the value of signal D is toggled by FF1 1140. At the falling edge 1232 of COLSEL 1230, a first value (the current state) of D is latched into FF2 (flip-flop 2) 1160. The first value of D is also latched in the memory cell 1110, when signal WL 1240 goes low (such that the value of signal D is toggled almost immediately after the current value of D is latched by memory cell 1110). Also at the falling edge 1232 of COLSEL 1230, the value of FF3 (flip-flop 3) 1170 is set to a logic one (which is the opposite value of the reset state) so that the RESET signal of FF4 (flip-flop 4) 1180 is held to a non-reset state. Accordingly, FF4 1180 is reset when signal RESET is asserted, and only before the first falling edge 1232 of COLSEL 1230 that occurs after the RESET signal is de-asserted. Thus, FF4 1180 is arranged to latch the result of a comparison of the first read (after reset) of the memory cell 1110 with the first value that is latched in FF2 1160 during the preceding write operation.

Memory cell 1110 is read during read period 1204. The rising edge of WL 1240 during read period 1204 causes the falling edge 1252 of signal RLSEL 1250, which couples the output of the memory cell 1110 to the sense amp 1150 inputs. The falling edge of WL 1240 during read period 1204 causes the rising edge of signal RLSEL 1250, which de-couples the output of the memory cell 1110 from the sense amp 1150 inputs. The rising edge of signal RLSEL 1250 causes the rising edge 1262 of ENSA 1260, which enables the sense amp 1150 to amplify the received charge from the memory cell 1110. The falling edge of ENSA 1260 is generated in response to the falling edge of CLK 1210 signal during the read period 1204. Signal output latch control (O/P LATCH CTL) is generated in response to ENSA such the falling edge of ENSA 1260 triggers the falling edge 1272 of O/P LATCH CTRL 1270.

As discussed above, the output of sense amp 1150 is monitored by XOR-gate 1156. When the read value of the output of sense amp 1150 is different than the first value that is latched in FF2 1160 (as determined by XOR-gate 1156), an error condition is determined. When the error condition is determined, the indication of the error (generated by XOR-gate 1156), the indication of the error is latched by FF4 1180 in response to the falling edge 1244 of O/P LATCH CTRL 1270.

The replica six-transistor memory cell allows "tuning" of memory cell by functionally testing the replica memory cell over a range of voltages to determine a voltage at which the replica cell begins to produce errors. The voltage at which the replica cell begins to produce errors can be determined by a linear search or by a binary search, for example.

The reduced voltage test on the replica is used to provide an actual basis from which to estimate the effects of operation at reduced voltages on all bit cells and accompanying logic. For example, the effects of lower operating voltages upon control, precharge, initialization, writing, and reading, sensing operations, and the like are evaluated using the replica memory cell and determining the minimum operating voltage at which errors start to be encountered. For example, write operations can be tested as discussed above with respect to FIG. 10. Read operations in a six-transistor arrangement the RWL can be tuned by reducing the RWL supply voltage (by providing a word line row that is separate from the actual memory cells word lines), by lowering the RWL voltage itself (as discussed above), and/or tuning the sense amp voltage differential (Vdiff) can be tuned by increasing or decreasing a capacitance in the first, the second, or both of halves of the sense amp 110 (as in FIG. 5c, for example).

The empirically determined value is, for example, adjusted upwards by a guard band factor that is preselected to preserve power and to maintain a desired degree of confidence that no error will likely occur. The guard band factor can be specified as an absolute value or a percentage and can be selected by a user with respect to the criticality of the application of the system and the probability of failure of the device that the replica circuit is used to predict performance.

Figure 13:
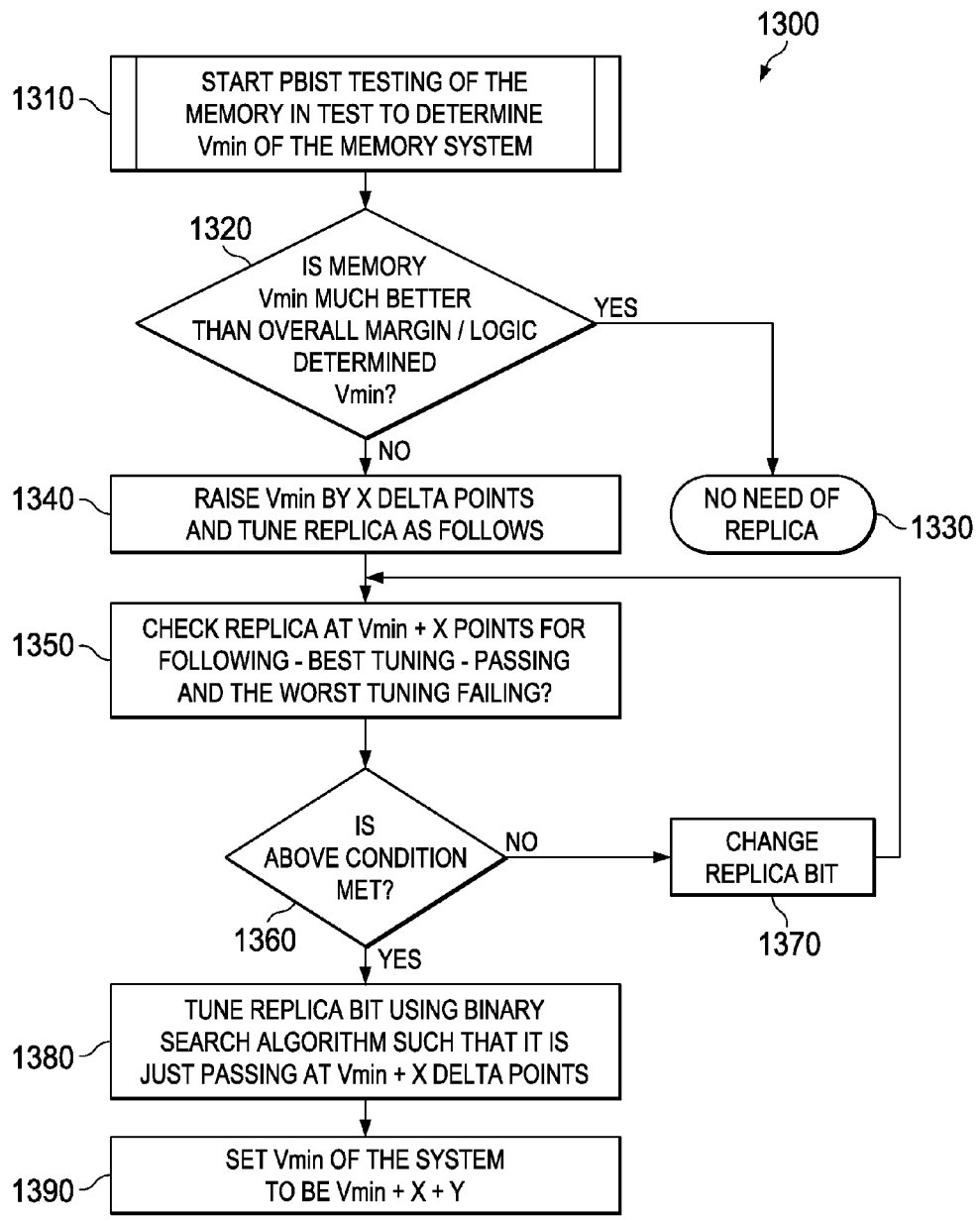
FIG. 13 is a flow diagram illustrating determining a minimum operating voltage (Vmin) in a replica memory cell for memory error prediction in accordance with embodiments of the disclosure.

FIG. 13 is a flow diagram illustrating determining a minimum operating voltage (Vmin) in a replica memory cell for memory error prediction in accordance with embodiments of the disclosure. In operation 1310, power built-in self-test (PBIST) testing of the memory is initiated to determine a Vmin of the memory system.

In operation 1320 it is determined whether the minimum operating voltage that is determined for memory operations in a device is substantially (e.g., above the margin of a preselected guard band) better than the minimum operating voltage that is determined for logic circuits in the device. (The device may include memory devices on a first substrate and logic circuits on a second substrate.) If it is determined that the minimum operating voltage for the memory is substantially better than the minimum operating voltage that is determined for logic circuits in the device, program flow terminates at operation 1330 because there is no need to use a replica circuit for memory operations. Otherwise, program flow continues in operation 1340.

In operation 1340, an initial Vmin is raised by X delta points for tuning a replica circuit, where X is an initial estimation that is selected to provide an optimal distribution of successes and failures over which different values for tuning circuits are swept (e.g., from low values to high values). Program flow continues in operation 1350. In operation 1350, the replica circuit is tested using a test operating voltage of "Vmin+X delta points" by tuning circuits (by sweeping the values, for example) to obtain the values at which the least number of errors occur (best tuning for passing) and for the greatest number of errors occur (worst tuning failing). The replica tuning circuits may include a programmable capacitance for selectively balancing (or unbalancing) internal nodes (e.g., nodes BT and BC) of a sense amp.

Program flow continues in operation 1360, where it is determined whether both tuning values for failing and tuning values for passing were obtained. If both the tuning values for failing and tuning values for passing were obtained were not obtained, program flow proceeds to operation 1370 where the replica bit is changed for a new test and program flow branches back to operation 1350 where a higher test operating voltage is used (when no passing values were obtained, for example) or a lower test operating voltage is used (when no failing values were obtained, for example). Otherwise, program flow proceeds to operation 1380.

In operation 1380, the replica bit is tuned using a binary search algorithm to obtain a value that is "just passing" (e.g., just above a value at which the replica starts to produce errors) at Vmin+X delta points. Program flow proceeds to operation 1390 where the Vmin of the system is determined to be Vmin+X points+Y, where Y is a guard band selected to avoid encountering errors in the replica, but low enough to save substantial (e.g., measurable) amounts of operating power.

Figure 14:
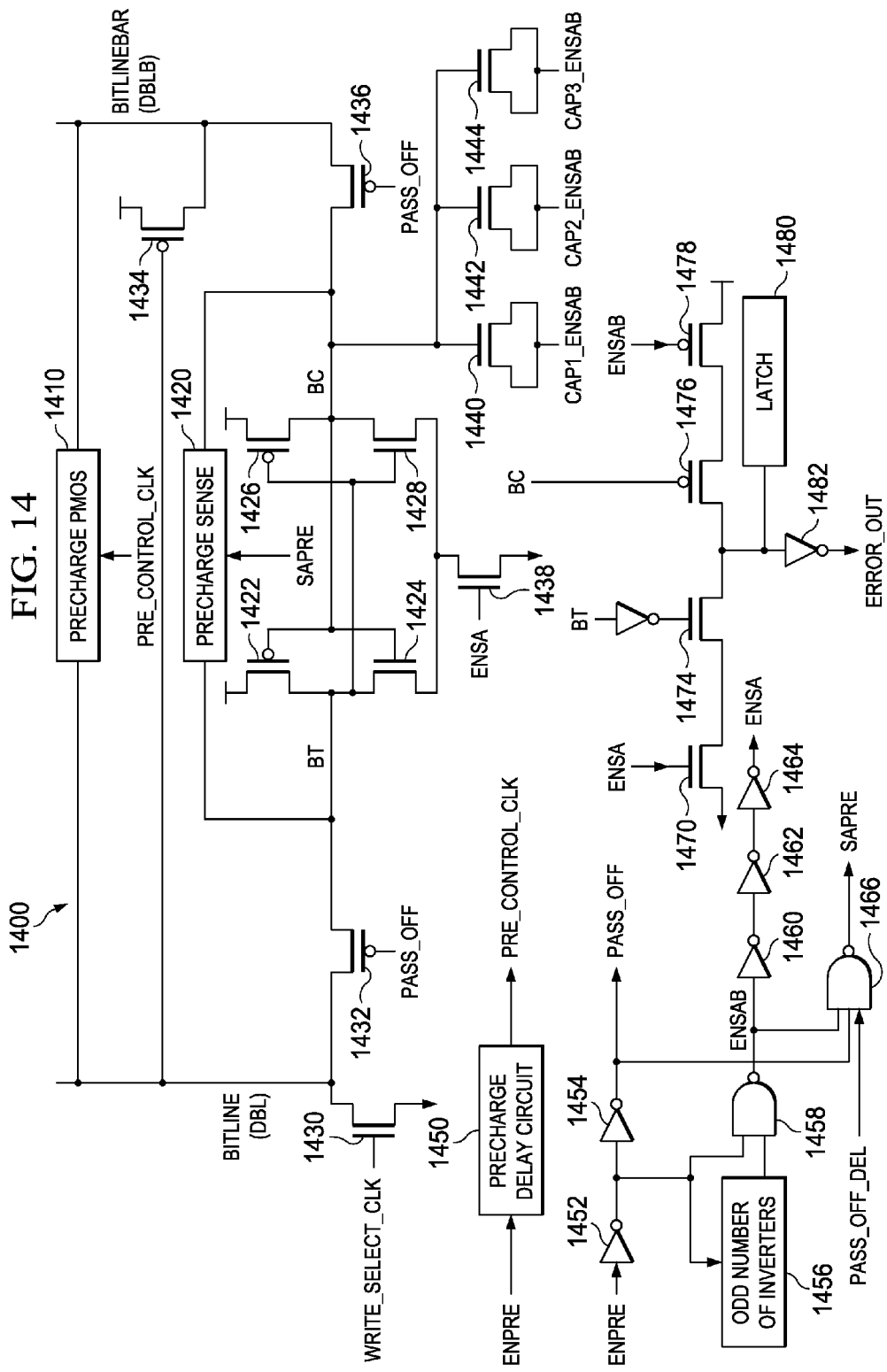
FIG. 14 is a schematic diagram illustrating memory error prediction by detection of unbalanced capacitances and incorrect sensing of memory cells in accordance with embodiments of the disclosure.

FIG. 14 is a schematic diagram illustrating memory error prediction by detection of unbalanced capacitances and incorrect sensing of memory cells in accordance with embodiments of the disclosure. Replica sense amp 1400 is arranged to perform detection of potential memory failures that might occur due to an incomplete precharging one of the bit-lines. For example, an insufficient precharge period and capacitive imbalances in self-timed memory might lead to the sense amps incorrectly reading the charge stored in memory cells.

Pre-charging is typically a last stage of a read cycle from a sense amp, and thus is a common source of failures when the read cycle is too short (and/or the operating voltage is too low) with respect to the response time of a sense amp. An incomplete bit line precharge often results in read failures because an insufficient bit line precharge affects the voltage differential (Vdiff) at a sense-amplifier input when sense amplifier is enabled.

Replica sense amp 1400 is arranged as a skewable (e.g., changing the relative balance of capacitances of the internal sense nodes) precharge sense amplifier replica. The replica shares electrical operating characteristics with operational circuits (such as operational sense amps) that are being replicated by the replica. The precharge sense amplifier replica is arranged having tunable capacitive coupling wherein the capacitive coupling is tuned (selectively balanced/unbalanced) at lowered operating voltages to cause detectable operating errors in the replica ("prediction"). The capacitive coupling is ultimately tuned such that there is a relatively small safety margin so that errors in the replica circuit typically would not occur (but would occur in the replica before being manifest in operational sense amps).

When an operating error in the replica is detected, an action upon the system (replica and non-replica circuits) is taken so that operating errors that would otherwise occur in actual operational (e.g., non-replica) memory cells are avoided. For example, an action to be taken to avoid operating errors that would otherwise occur includes increasing the operating voltage of the system. The disclosed skewed precharge sense amplifier is used in combination with the disclosed setup error prediction system for memory to logic interface paths to form a complete error prediction system for split rail memory architectures that support lowered operating voltages.

In operation, signal pre-control clock (PRE_CONTROL_CLK) is derived from an enable preamp (ENPRE) external clock signal via precharge delay circuit 1450. Before the pre-control clock transitions high, the data bit line (DBL) and the data bit line bar (DBLB) are both precharged by PMOS 1410 transistor(s).

Signal pass-off (PASS-OFF) is also derived from the ENPRE signal via inverters 1452 and 1454. The pass-off signal (when low) is arranged to switch PMOS transistors 1432 and 1436 to an "on" state, which allows the internal sense amp nodes bit true (BT) and bit complement (BC) to be respectively precharged by signal DBL and DBLB.

When the pre-control clock transitions high, the write select clock (WRITE_SEL_CLK) is also transitions high and is arranged to activate the data bit line (DBL) low via transistor 1430 while forcing the data bit line bar (DBLB) high via transistor 1430. When PMOS transistors 1432 and 1436 are switched to an "off" state (in response to the rising edge of ENPRE, for example), the voltage of internal sense amp node BC drops by a substantial amount due to capacitive coupling (e.g., from gate capacitors 1440, 1442, and 1444) and the voltage source being switched off. A substantial amount of voltage drop is an amount of voltage drop that results in an incorrect reading by the sense amp (such as when the voltage of node BC drops below node BT). In an embodiment, a voltage drop of 40 millivolts is substantial.

The signal enable sense amp bar (ENSAB) pulse is triggered in response to the rising edge of signal ENPRE. Signal ENSAB is a negative-going pulse that is generated by an odd number of inverters 1456 and gate 1458 that are arranged as a pulse generator. The width of the pulse is adjustable by the number of inverters used in the odd number of inverters 1456. The signal enable sense amp (ENSA) is a positive going pulse that is generated via inverters 1460, 1462, and 1464 from signal ENSAB.

Transistors 1422, 1424, 1426, and 1428 are arranged as the cross-coupled inverters of a sense amplifier where node BT is coupled to the input of the inverter formed by transistors 1426 and 1428 and where node BC is coupled to the input of the inverter formed by transistors 1422 and 1424. The sense amplifier is triggered by the assertion of signal ENSA (which is coupled to the gate of NMOS transistor 1438) that simultaneously couples the drains of transistors 1424 and 1428 to ground (to force either node BT or BC to ground depending on the relative charges "sensed" by the gates of each inverter).

In correct operation, the node BT remains higher than node BC, which causes NMOS transistor 1428 to lower node BC to ground. Transistors 1470 and 1478 are enabled by the active states of ENSA and ENSAB respectively. Transistor 1474 is "off" due to the high state of node BT (during correct operation), while transistor 1476 is "on" due to the low state node BC (during correct operation). Thus, the gate formed by transistors 1470, 1474, 1476, and 1478 passes a high logical value as an input to inverter 1482 (which drives the error_out signal with a low value).

When an error is encountered (such as when the node DBL and thus node BT do not fully precharge), node BC does not drop below BT when the pass transistor 1436 is shut off by the rising edge of signal pass_off. The rising edge of ENSA activates transistor 1438, which—in response to the stronger biasing by node BC—causes node BT to be driven to ground via NMOS transistor 1424.

Thus the logic state of node BT is low and the logic state of node BC is high. With transistors 1470 and 1478 being enabled by the transition to active states of ENSA and ENSAB respectively, the source of transistor 1474 drives the input of inverter 1482 to a low state (which indicates the presence of a detected error). Latch 1480 is arranged to latch the detected error until polled by system logic or reset, for example.

Signal sense amp precharge (SAPRE) is generated in response to the transitioning of the signals ENSAB and PASS_OFF to an inactive state. Thus, the precharge sense 1420 transistors are activated at the trailing (e.g., falling) edge of signal ENSA (which occurs before the trailing edge of the pre-control clock). Signal SAPRE is also generated in response to a delayed version (PASS-OFF_DEL) of signal PASS-OFF so that signal SAPRE is not triggerable before the rising edge of signal ENSA. Signal SAPRE is arranged to precharge the sense amplifier internal nodes BT and BC by activating the precharge sense 1420 transistors that provide a power signal for precharging signals BT and BC.

Due to manufacturing inconsistencies, the capacitance of the nodes for signals BT and BC are not (normally) physically identical. When the capacitance of the nodes is not equal, the signals BT and BC do not achieve the same voltage at the end of a relatively short precharge cycle (e.g., when the pre-control clock is active low). The greater the voltage differential (Vdiff) of signals BT and BC (due to, for example, an inadequate precharge of node DBL), the greater the likelihood that the relatively charge read from a memory cell (such as a six-transistor-based memory cell 1110) would be interpreted incorrectly when sensed by a sense amp.

The relative capacitance at nodes BT and BC is selectively adjusted using parametric driver 560. FIG. 5c is schematic diagram illustrating a variable capacitance parametric driver in accordance with embodiments of the disclosure. As mentioned above, variable capacitance is used in replica bit cell to degrade sense-amp voltage differential tolerances. The variable capacitance is used to change the performance of the read operation. When reading a differential voltage signal, variable capacitive coupling is used to create an artificial imbalance in the sense amplifier that is arranged to read the differential voltage signal. The capacitive imbalance thus negatively affects the voltage differential generated at the sense amplifier by the reference bit, which thus increases the likelihood of failure of the reference bit cell.

Parametric driver 560 in an example embodiment is arranged to drive a precharge line. The capacitance of the precharge line typically varies as a function of the operating voltage used to power the circuitry coupled to the precharge line. Parametric driver 560 includes a driver 570 and a capacitive network 580. Driver 570 is arranged to generate a signal used to precharge bit lines for a bit cell of a memory device, for example. The precharge line is coupled to the capacitive network 580. The (effective) capacitance of the capacitive network 580 is selected by selectively asserting one or more of capacitor enable lines (CAP1_ENSAB, CAP2_ENSAB, and/or CAP3_ENSAB).

In similar fashion as described in FIGS. 5a and 5b, a controller (such as voltage controller 410) is arranged to select an operating voltage for the parametric driver and to select one or more of the capacitors. Selecting one or more of the capacitors individually selects each "leg" of the capacitive network 580 to select a composite capacitance of the parametric driver. The gate areas (used as capacitors) in each leg can be selected to have different sizes (such as a geometric progression) so that the delay can be finely adjusted using a range of binary values, for example.

The drive-strength is independently adjustable using drive-strength network 580. A controller (such as voltage controller 410) is arranged to select an operating voltage for the parametric driver and to select one or more of control signals CTRL1, CTRL2, CTRL3, and CTRL4. Selecting one or more of control signals CTRL1, CTRL2, CTRL3, and CTRL4 individually selects each "leg" of the drive-strength network to select a composite drive strength of the parametric driver. The transistors driving each leg can be selected to have different sizes (such as a geometric progression) so that the drive strength can be finely adjusted using a range of binary values, for example.

The capacitive network can also be used, for example, in place of the delay circuit 232, to form an error-predictive circuit that is sensitive to a programmable capacitance. A predictive operating error occurs when a memory cell having an input that is adjusted by an operating parameter fails to latch the same value as a memory cell coupled to the (unadjusted) input. Thus, both the operating voltage and the input adjustment parameter (e.g., capacitance) can be adjusted to predictively determine an operating error. The operating voltage (used in normal operation, for example) can be selected in response to both the detection of the error and the selected capacitance used. Thus, each kind of the parametric drivers 500, 540, and 580 is used to test the effect of the reduction in the array voltage on the bit cell functional behavior. In contrast to delay producing elements (such as inverters, NAND-, and NOR-gates), the response to lowering of supply to the bit cells has second-order effects (such as read failures due to insufficient $I_{read}$ that affects the voltage differential, or write failures due to the inability to write into the bit cell).

With reference again to FIG. 14, gate capacitors 1440, 1442, and 1444 form a programmable capacitance network that is arranged to tune the capacitance of node BC (e.g., with respect to node BT) in response to an input command. For example, the capacitance of node BC is increased or lessened in accordance with the state of signals capacitor 1 enable sense amp bar (CAP1_ENSAB), capacitor 2 enable sense amp bar (CAP2_ENSAB), and capacitor 3 enable sense amp bar (CAP3_ENSAB). More or less gate capacitors of the same and/or differing sizes can be used to form the programmable capacitance network as discussed above with reference to FIG. 5c. Thus, the capacitance of node BC is tunable, and can be tuned in accordance with the method discussed above with reference to FIG. 13 to obtain a minimum operating voltage that is selected to produce detected errors in the replica circuit before errors would be caused in operational circuitry by the operating at the selected minimum operating voltage.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A memory apparatus comprising:
a state machine having a reset state, a first state where a first flip flop is configured to generate a data signal, and a second state where a second flip flop is configured to latch a first value of the data signal; and
a memory cell configured to be latched with the first value of the data signal, wherein a third flip flop in the state machine is configured to be in the reset state and then to a non-reset state such that a result of a comparison of a first value of the memory cell with the value of the data signal that is latched in the second flip flop, indicating an error, is stored in a fourth flip flop in the state machine.

2. The apparatus of claim 1, comprising a voltage controller that is arranged to apply a subsequent operating voltage to the memory cell that is higher than a previously applied operating voltage in response to the comparison.

3. The apparatus of claim 1, wherein the memory cell is a six-transistor static RAM.

4. The apparatus of claim 1, wherein the memory cell has an electrically degraded path for testing a write operation exercising at least one of a write word line (WWL) node, a word bit line WBL node, and a column select signal (COLSEL) node, wherein the subsequent operating voltage is selected in response to the comparison.

5. The apparatus of claim 1, wherein the memory cell has an electrically degraded path for testing a read operation performing at least one of reducing the RWL supply voltage, lowering the RWL voltage itself, and tuning the sense amp voltage differential (Vdiff) by increasing or decreasing a capacitance in a the sense amp coupled to the memory cell, wherein the subsequent operating voltage is selected in response to the comparison.

6. A method for determining a minimum operating voltage in a memory, comprising:
precharging bit lines and internal nodes of a memory cell;
writing a first value of a data signal to the internal nodes of the memory cell, the first value of the data signal also being latched in a flip flop;
enabling a sense amplifier that is coupled to the internal nodes to generate an output, wherein at least one of the internal nodes is coupled to a programmable capacitance network;
determining whether the output is equal to the first value of the data signal being latched; and
adjusting a capacitance value that is generated by the programmable capacitance network in response to the result of the determination.

7. The method of claim 6, comprising selecting a subsequent operating voltage in response to the determination whether the output is equal to the first value of the data signal being latched.

8. The method of claim 6, wherein the capacitance is adjusted to increase the capacitance of the programmable capacitance network, wherein the capacitance is increased relative to the capacitance of the complementary internal node.

9. The method of claim 6, comprising providing an error signal in response to the determination whether the output is equal to the first value of the data signal being latched.

* * * * *